(12) United States Patent
Choung et al.

(10) Patent No.: US 7,824,972 B2
(45) Date of Patent: Nov. 2, 2010

(54) PRODUCING A THIN FILM TRANSISTOR SUBSTRATE BY USING A PHOTORESIST PATTERN HAVING REGIONS OF DIFFERENT THICKNESSES

(75) Inventors: Jong-hyun Choung, Hwaseong-si (KR); Byeong-jin Lee, Yongin-si (KR); Hong-sick Park, Suwon-si (KR); Sun-young Hong, Yongin-si (KR); Bong-kyun Kim, Incheon (KR); Won-suk Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 128 days.

(21) Appl. No.: 11/985,199

(22) Filed: Nov. 13, 2007

(65) Prior Publication Data
US 2008/0164471 A1    Jul. 10, 2008

(30) Foreign Application Priority Data
Nov. 20, 2006    (KR)    ........................ 10-2006-0114702

(51) Int. Cl.
*H01L 21/00* (2006.01)
*H01L 21/84* (2006.01)

(52) U.S. Cl. ...................................... 438/158; 438/159
(58) Field of Classification Search ................. 438/158, 438/159

See application file for complete search history.

(56) References Cited

U.S. PATENT DOCUMENTS

| 5,994,174 A | 11/1999 | Carey et al. |
| 2006/0024895 A1 | 2/2006 | Kim |
| 2006/0046365 A1 | 3/2006 | Park et al. |

FOREIGN PATENT DOCUMENTS

| CN | 1728363 A | 2/2006 |
| CN | 1744300 A | 4/2006 |
| JP | 06-349338 | 12/1994 |

OTHER PUBLICATIONS

EPO Search Report corresponding to EP 07020791.5, dated Apr. 18, 2008, 9 pages.

*Primary Examiner*—Howard Weiss
(74) *Attorney, Agent, or Firm*—Innovation Counsel LLP

(57) ABSTRACT

A thin film transistor substrate that has reduced production cost and defect rate is presented. The thin film transistor substrate includes a gate wiring line formed on an insulating substrate and including a gate electrode, a data wiring line formed on the gate wiring line and including a source electrode and a drain electrode, a passivation layer pattern formed on parts of the data wiring line other than the drain electrode and a pixel region, and a pixel electrode electrically connected to the drain electrode. The pixel electrode includes zinc oxide.

13 Claims, 19 Drawing Sheets
(2 of 19 Drawing Sheet(s) Filed in Color)

PRODUCING A THIN FILM TRANSISTOR SUBSTRATE BY USING A PHOTORESIST PATTERN HAVING REGIONS OF DIFFERENT THICKNESSES

This application claims priority from Korean Patent Application No. 10-2006-0114702 filed on Nov. 20, 2006 in the Korean Intellectual Property Office, the disclosure of which is incorporated herein by reference in its entirety.

BACKGROUND OF THE INVENTION

1. Field of the Invention

The present invention relates to a thin film transistor substrate and a method of producing the same and, more particularly, to a thin film transistor substrate that has reduced production cost and defect rate and a method of producing the same pixel electrode.

2. Description of Related Art

A liquid crystal display includes two substrates and a liquid crystal layer that is interposed between the two substrates. One of the two substrates is a thin film transistor substrate. In the thin film transistor substrate, a plurality of wiring lines is formed on an insulating substrate. A representative example of a process of forming wiring lines includes a photolithography process in which constituent substances are layered and patterned using a mask process. However, since the photolithography process includes numerous processes such as deposition of thin film, application of a photoresist, alignment of a mask, exposing, developing, etching, and stripping, the process time is long and product cost is high.

A lift-off process has been used to reduce the number of mask processes. In a lift-off process, when a passivation layer and a pixel electrode of a thin film transistor substrate are used, the passivation layer is patterned using a photoresist pattern, a conductive substance is layered on the entire substrate surface, and the photoresist pattern and some of the conductive substance for the pixel electrode that is provided on the photoresist pattern are simultaneously removed using a stripper to form the pixel electrode.

To remove the photoresist pattern and an upper surface that is coated with the conductive substance, the stripper is brought into contact with a lateral surface or a lower surface of the photoresist pattern. In connection with this, a contact area of the stripper and the photoresist pattern must be large enough to prevent the formation of unacceptable patterns resulting from the remaining photoresist pattern. That is, it is required that the passivation layer, which is provided under the photoresist pattern, be overetched to form desirable undercuts in the photoresist pattern. It is also required that step coverage of the conductive substance for the pixel electrode, which is provided on the photoresist pattern, is not very high. Meanwhile, in the lift-off process, since the stripper is frequently reused, defects may form on the thin film transistor substrate when the conductive substance for the pixel electrode remains in the stripper undissolved. In addition, since the conductive substance for the pixel electrode is removed during the lift-off process, reduction in the production cost of the thin film transistor substrate may be affected.

Accordingly, there remains a need to develop a thin film transistor substrate using a conductive substance for a pixel electrode that has desirable step coverage, and can desirably dissolve in a stripper to improve the lift off performance at a reduced cost.

SUMMARY OF THE INVENTION

The present invention provides a thin film transistor substrate that has reduced production cost and defect rate. The present invention is also provides a method of producing the thin film transistor substrate.

According to one aspect, the present invention is a thin film transistor substrate including a gate wiring line formed on an insulating substrate and including a gate electrode, a data wiring line formed on the gate wiring line and including a source electrode and a drain electrode, a passivation layer pattern formed on the data wiring line except on a part of the drain electrode and a pixel region, and a pixel electrode electrically connected to the drain electrode and including zinc oxide.

According to another aspect, the present invention is a thin film transistor substrate including a gate wiring line formed on an insulating substrate and including a gate electrode, a data wiring line formed on the gate wiring line and including a source electrode and a drain electrode, a passivation layer pattern formed on the data wiring line except on a part of the drain electrode and a pixel region, and a pixel electrode electrically connected to the drain electrode, contacting the insulating substrate and including zinc oxide.

According to still another aspect, the present invention is a method of producing a thin film transistor substrate. The method includes forming a gate wiring line including a gate electrode on an insulating substrate, forming a data wiring line including a source electrode and a drain electrode on the gate wiring line, forming a passivation layer pattern on the data wiring line except for a part of the drain electrode and a pixel region, and forming a pixel electrode electrically connected to the drain electrode. The pixel electrode includes zinc oxide.

The patent or application file contains at least one drawing executed in color. Copies of this patent or patent application publication with color drawings will be provided by the U.S. Patent and Trademark Office upon request and payment of the necessary fee.

BRIEF DESCRIPTION OF THE DRAWINGS

The patent or application file contains at least one drawing executed in color. Copies of this patent or patent application publication with color drawings will be provided by the U.S. Patent and Trademark Office upon request and payment of the necessary fee.

The above and other features and advantages of the present invention will become more apparent by describing in detail preferred embodiments thereof with reference to the attached drawings, in which.

DESCRIPTION OF THE EMBODIMENTS

Figure 1A:
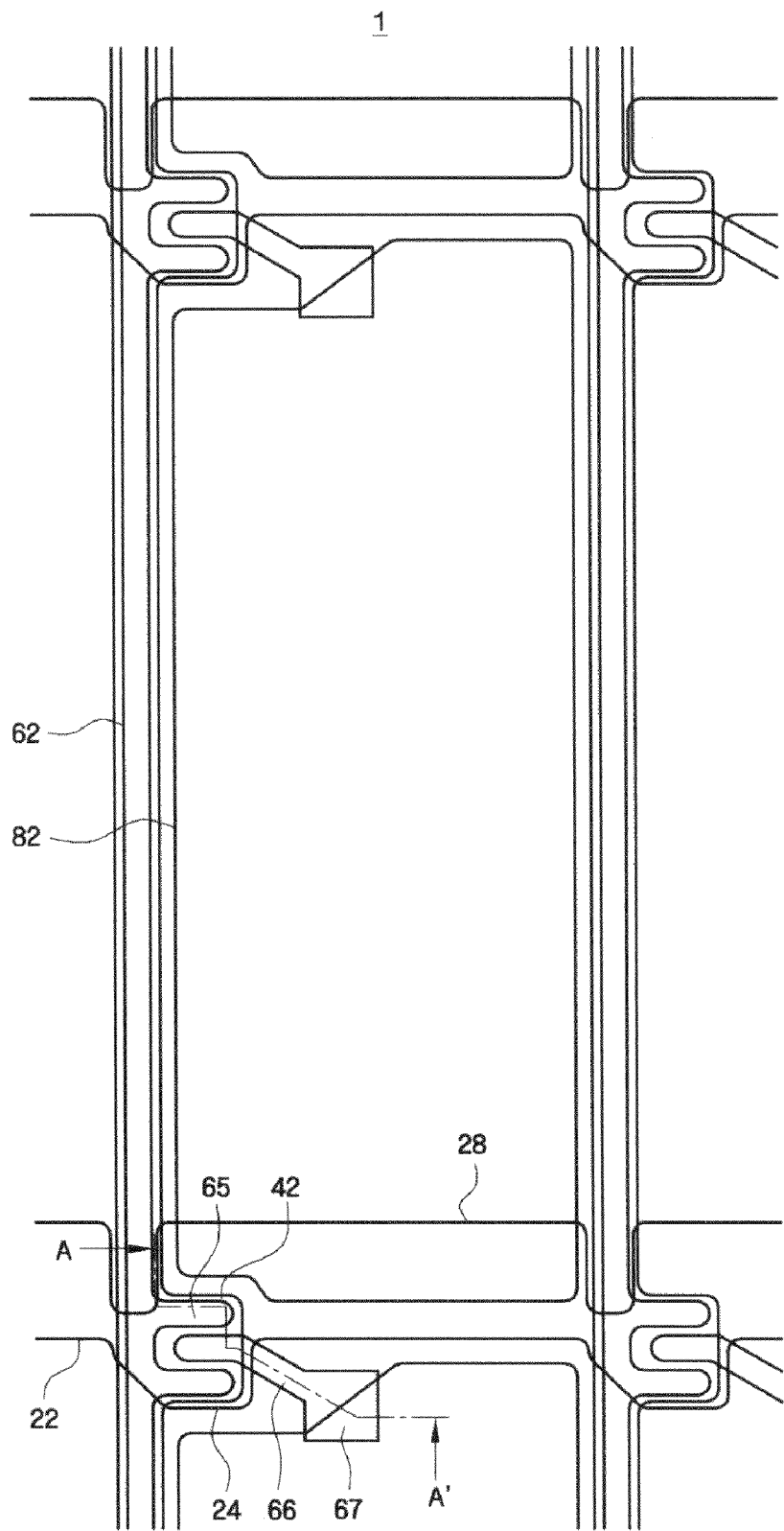
FIG. 1A is a layout view of a thin film transistor substrate according to a first embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art. The present invention will be defined by the appended claims. Like reference numerals refer to like elements throughout the specification.

It will be understood that when an element or layer is referred to as being "on" on "connected to" another element or layer, it can be in contact with the other element or layer or intervening elements or layers may be present. In contrast, when an element is referred to as being "directly on" or "directly connected to" another element or layer, there are no intervening elements or layers present. Like reference numerals refer to like elements throughout the specification.

Spatially relative terms, such as "below", "beneath", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like reference numerals refer to like elements throughout the specification.

Hereinafter, embodiments of the present invention will be described in detail with reference to the accompanying drawings.

Figure 1B:
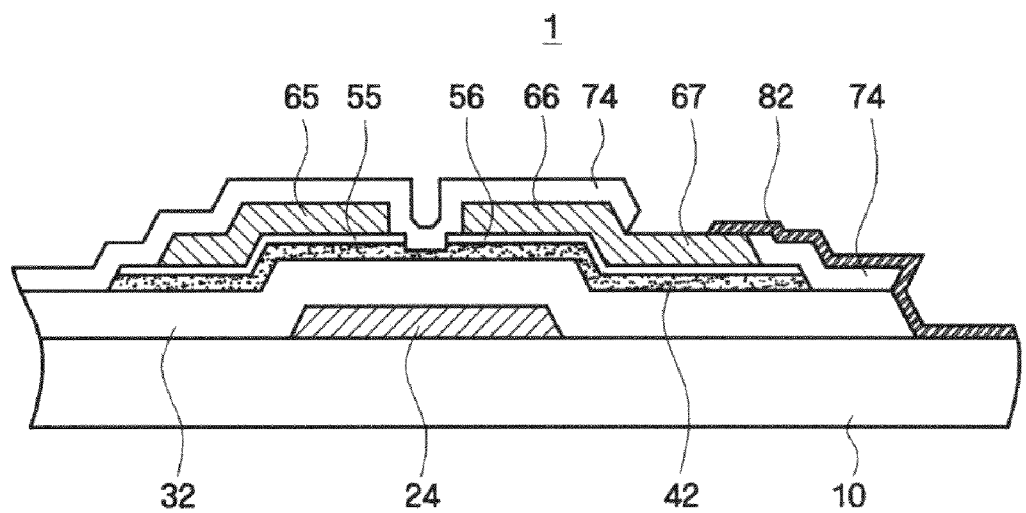
FIG. 1B is a sectional view of the thin film transistor substrate taken along the line A-A' of FIG. 1A.

A thin film transistor substrate according to a first embodiment of the present invention will be described in detail with reference to FIGS. 1A and 1B. FIG. 1A is a layout view of the thin film transistor substrate according to the first embodiment of the present invention. FIG. 1B is a sectional view of the thin film transistor substrate taken along the line A-A' of FIG. 1A.

A thin film transistor substrate 1 according to the first embodiment of the present invention is provided with gate wiring lines 22 and 24, a storage wiring line 28, a gate insulating layer pattern 32, an active layer pattern 42, ohmic contact layer patterns 55 and 56, data wiring lines 62, 65, 66, and 67, an overetched passivation layer pattern 74, and a pixel electrode 82 that are formed on an insulating substrate 10.

The insulating substrate 10 may be made of a substance having desired levels of heat resistance and light transmission, such as transparent glass or plastics.

The gate wiring lines 22 and 24 are formed on the insulating substrate 10 and extend in a first direction. Typically, the gate wiring lines 22, 24 are disposed parallel to a long side of the thin film transistor substrate 1.

The gate wiring lines 22 and 24 include a plurality of gate lines 22 that transmits gate signals and gate electrodes 24 protruding from the gate lines 22. The gate electrode 24 constitutes three terminals of the thin film transistor in conjunction with a source electrode 65 and a drain electrode 66, which are described below.

The storage wiring 28 may be formed by expanding a portion of the gate line 22. However, the storage wiring 28 is not limited to being made this way. For example, it may be separated from the gate wiring lines 22, 24 in some embodiments. In addition, the shape of the storage wiring line 28 may vary, and the storage wiring line 28 may be omitted if necessary.

The gate wiring lines 22 and 24, and the storage wiring line 28 may be made of an aluminum-based metal, such as aluminum (Al) and an aluminum alloy, a silver-based metal, such as silver (Ag) and a silver alloy, a copper-based metal, such as copper (Cu) and a copper alloy, a molybdenum-based metal, such as molybdenum (Mo) and a molybdenum alloy, chromium (Cr), titanium (Ti), or tantalum (Ta). In addition, the gate wiring lines 22 and 24, and the storage wiring line 28 may have a multilayered structure including two conductive layers having different physical properties (not shown). Meanwhile, the gate wiring lines 22 and 24, and the storage wiring line 28 may be formed by applying PEDOT (PolyEthyleneDiOxyThiophene) that is a conductive organic polymer-based substance using a predetermined coating process, or by printing the conductive organic polymer-based substance using an inject-printing process.

A gate insulating layer pattern 32 that is made of an inorganic insulating substance such as silicon oxide (SiOx) or silicon nitride (SiNx) or an organic insulating substance such as BCB (BenzoCycloButene), an acryl-based substance, or polyimide covers the gate wiring lines 22 and 24 and the storage wiring line 28 on the gate wiring lines 22 and 24 and the insulating substrate 10. That is, the gate insulating layer pattern 32 may be formed to expose a pixel region. In connection with this, the pixel region is defined by the gate wiring lines 22 and 24 and data wiring lines 62, 65, 66, and 67, and may be considered the region through which light emitted from a backlight assembly (not shown) passes in the liquid crystal display including the thin film transistor substrate 1.

The active layer pattern 42 that is made of hydrogenated amorphous silicon, polysilicon, or the conductive organic substance is formed on an upper part of the gate insulating layer pattern 32.

The active layer pattern 42 may have any suitable shape, and may be formed as an island or a stripe, for example. When the active layer pattern has the stripe shape as shown in the present embodiment, the active layer pattern may be provided under the data line 62 and extend to an upper part of the gate electrode 24. The active layer pattern 42 according to the present embodiment may substantially overlap all of the gate electrode and the data wiring lines 62, 65, 66, and 67 as described below. That is, the active layer pattern 42 may protrude from the source electrode 65 and the drain electrode 66. However, the shape of the active layer pattern 42 is not limited to the stripe, but may vary. In the case of when the active layer pattern 42 has an island shape, the active layer pattern 42 may be provided on the gate electrode 24 to overlap the gate electrode 24, and also overlap at least a portion of the source electrode 65 and the drain electrode 66.

Ohmic contact layer patterns 55 and 56 that are made of silicide, n+ hydrogenated amorphous silicon in which an n-type impurity is doped at a high concentration, or ITO in which a p-type impurity is doped may be formed on the upper part of the active layer pattern 42. The ohmic contact layer patterns 55 and 56 are provided on the active layer pattern 42 to form a pair, and improves the contact characteristic between the source electrode 65 and the drain electrode 66 as described below, and the active layer pattern 42. When the contact characteristic between the active layer pattern 42 and the source electrode 65 and the drain electrode 66 that are provided on the upper part of the active layer pattern 42 is acceptable, the ohmic contact layer patterns 55 and 56 may be omitted.

The data wiring lines 62, 65, 66, and 67 that include the data lines 62, the source electrode 65, the drain electrode 66, and a drain electrode expanded part 67 are formed on the ohmic contact layer patterns 55 and 56.

The data lines 62 are disposed on the ohmic contact layer patterns 55 and 56 in a second direction. The second direction is substantially perpendicular to the first direction. A plurality of data lines is provided parallel to a short side of the thin film transistor substrate 1.

The source electrodes 65 are connected to the data lines 62. A plurality of source electrodes 65 may be connected to the single data line 62. The source electrodes 65 face the drain electrodes 66 that are spaced apart from the source electrodes. The active layer pattern 42 is exposed in the area between the source electrode 65 and the drain electrode 66.

The drain electrode 66 may include the drain electrode expanded part 67 that is formed by expanding an end of the drain electrode 66. In the present embodiment, at least a portion of the drain electrode expanded part 67 does not overlap the overetched passivation layer pattern 74 as described below, and is electrically connected directly to the pixel electrode 82. That is, the overetched passivation layer pattern 74 and the pixel electrode 82 may be formed on the same layer on the drain electrode expanded part 67.

The drain electrode expanded part 67 is formed outside the pixel region to prevent an aperture ratio from being reduced.

The data wiring lines 62, 65, 66, and 67 may be made of a refractory metal that has a high melting point, such as chromium, molybdenum-based metal, tantalum, and titanium. Additionally, the data wiring lines 62, 65, 66, and 67 may have a multilayered structure that includes a lower refractory metal layer (not shown) and an upper layer (not shown) which is made of a substance having low resistance and provided on the lower refractory metal layer. Examples of the multilayered structure may include a dual layer structure that has a lower chromium layer and an upper aluminum layer or a lower aluminum layer and an upper molybdenum layer, and a triple layer structure that has a molybdenum layer, an aluminum layer, and a molybdenum layer.

The overetched passivation layer pattern 74 that is made of an organic insulating film is formed on the data wiring lines 62, 65, 66, and 67 and the exposed gate insulating layer pattern 32. The overetched passivation layer pattern 74 of the present embodiment includes two regions that are spaced apart from each other to expose at least a portion of the drain electrode 66, specifically, at least a portion of the drain electrode expanded part 67. The overetched passivation layer pattern 74 may not be formed in the pixel region through which light emitted from the backlight assembly passes. In connection with this, the overetched passivation layer pattern 74 is made of an inorganic substance that includes silicon nitride or silicon oxide, an organic substance that has excellent planarization property and photosensitivity, or a low dielectric insulating substance, such as a-Si:C:O or a-Si:O:F, that is formed using plasma enhanced chemical vapor deposition (PECVD). Additionally, the overetched passivation layer pattern 74 may have a dual layer structure including a lower inorganic layer and an upper organic layer in order to assure excellent property of the organic layer and to protect the exposed portion of the active layer pattern 42.

The pixel electrode 82 may be formed in the pixel region of the insulating substrate 10, and is electrically directly connected to the drain electrode expanded part 67. That is, the overetched passivation layer pattern 74 may not be provided under the pixel electrode 82 while a portion of the ohmic contact layer pattern 56 and an end of the gate insulating layer pattern 32 that protrude from the drain electrode expanded part 67 are formed under the pixel electrode 82.

The pixel electrode 82 of the present embodiment is made of a substance that includes zinc oxide. To be more specific, the pixel electrode 82 may be made of a substance that contains zinc oxide and one or more of $Al_2O_3$, $AlF_3$, $B_2O_3$, $Ga_2O_3$, $Y_2O_3$, $SiO_2$, $SiO$, $TiO_2$, $ZrO_3$, $HfO_2$, and $GeO_2$ as an additive. The additive is selected in consideration of the desired resistance level and a current characteristic of the thin film transistor substrate 1. The pixel electrode 82 may include ZAO (aluminum doped zinc oxide). The step coverage of the ZAO is not very high. Accordingly, it is easy to form the pixel electrode 82 having the structure shown in the present embodiment using ZAO, and it is possible to reduce the production cost of the thin film transistor substrate 1 due to the low-priced ZAO. The pixel electrode 82 may be made of a transparent conductive substance such as ITO (Indium Tin Oxide) or IZO (Indium Zinc Oxide), or a reflective conductive substance such as copper (Cu) or silver (Ag). When ZAO is used, the production cost of the thin film transistor substrate 1 is reduced significantly but the current-voltage characteristic is not lower than when ITO is used.

Hereinafter, a method of producing the thin film transistor substrate according to the first embodiment of the present invention will be described in detail with reference to FIGS. 1A, 1B, and 2 to 13. FIGS. 2 to 13 are sectional views illustrating a method of producing a thin film transistor substrate according to the first embodiment of the present invention.

Figure 2:
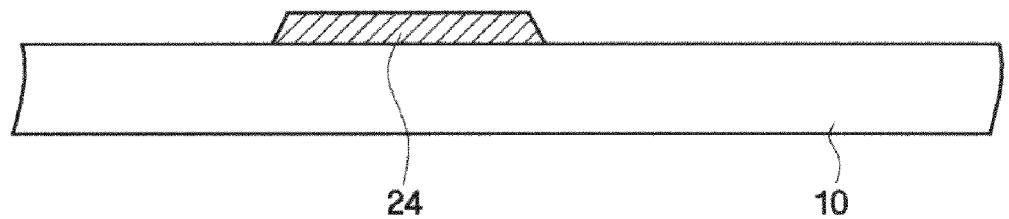
FIGS. 2 to 13 are sectional views illustrating a method of producing a thin film transistor substrate according to the first embodiment of the present invention.

First, with reference to FIGS. 1A and 2, gate wiring lines 22 and 24 that include a gate electrode 24, and a storage wiring line 28 are formed on an insulating substrate 10. To be more specific, a gate conductive layer is layered on the insulating substrate 10 using, for example, sputtering, and subjected to a photolithography process to form the gate line 22, the gate electrode 24, and the storage wiring line 28.

Figure 3:
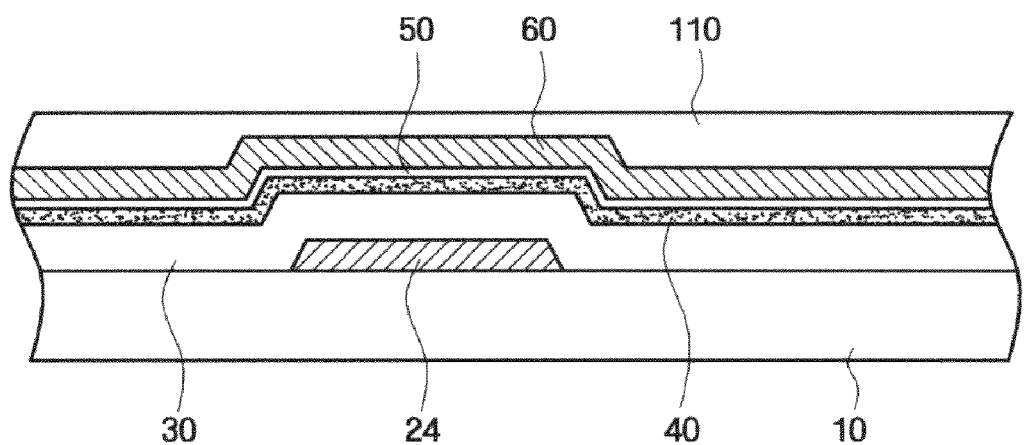

Subsequently, with reference to FIGS. 3 and 1A, a gate insulating layer 30, an active layer 40 that is made of hydrogenated amorphous silicon, and an ohmic contact layer 50 that is made of silicide, n+ hydrogenated amorphous silicon in which an n-type impurity is doped at a high concentration, or ITO in which a p-type impurity is doped, are layered on the resulting structure. The gate insulating layer 30, the active layer 40, and the ohmic contact layer 50 may be layered using, for example, chemical vapor deposition (CVD).

Subsequently, the conductive layer 60 for data wiring line is deposited on the ohmic contact layer 50 using, for example, sputtering, and a photoresist layer 110 is layered on the ohmic contact layer 50.

Figure 4:
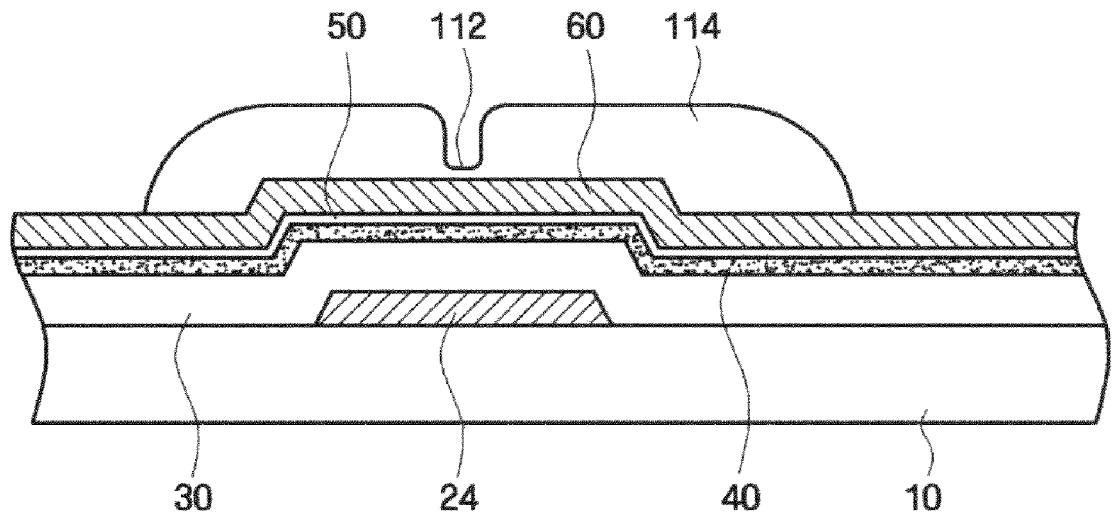

Subsequently, with reference to FIGS. 3, 4, and 1A, the photoresist layer 110 is patterned to form photoresist patterns 112 and 114 for data wiring line on the conductive layer 60 for data wiring line. The photoresist patterns 112 and 114 for data wiring line include two regions having different thicknesses, and the photoresist pattern 114 for data wiring line having a large thickness covers regions in which the data line 62, the drain electrode expanded part 67, the source electrode 65, and the drain electrode 66 are formed. The photoresist pattern 112 for data wiring line having a small thickness covers the gap between the source electrode 65 and the drain electrode 66. The above-mentioned photoresist patterns 112 and 114 for data wiring line that include the regions having different thicknesses may be formed using a slit mask or a half tone mask, both of which are well known.

Subsequently, with reference to FIGS. 1A, 4, and 5, the exposed conductive layer 60 for the data wiring line is etched using the photoresist patterns 112 and 114 as an etching mask. The etching of the conductive layer 60 for the data wiring line depends on the type and thickness of the conductive layer 60 that is used for the data wiring line. Preferably, the conductive layer 60 for the data wiring line is subjected to wet etching. As a result, the conductive layer patterns 61 for the data lines 62 and the data wiring lines are formed. At this point, the patterns of the source electrode 65 and the drain electrode 66 of the channel region are not formed, and the conductive layer patterns 61 for the data wiring lines are not separated but form a single body in the channel region.

Figure 5:
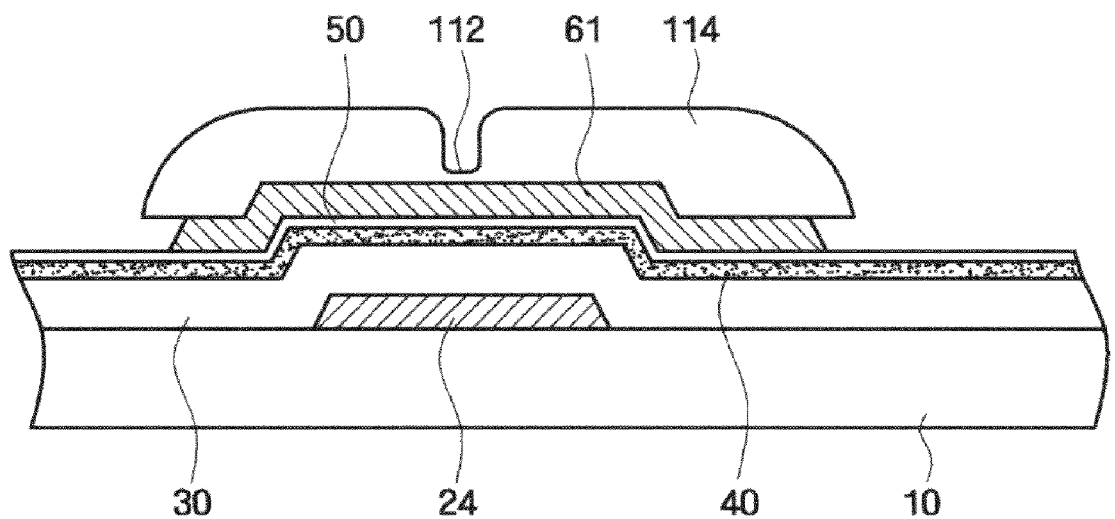
Figure 6:
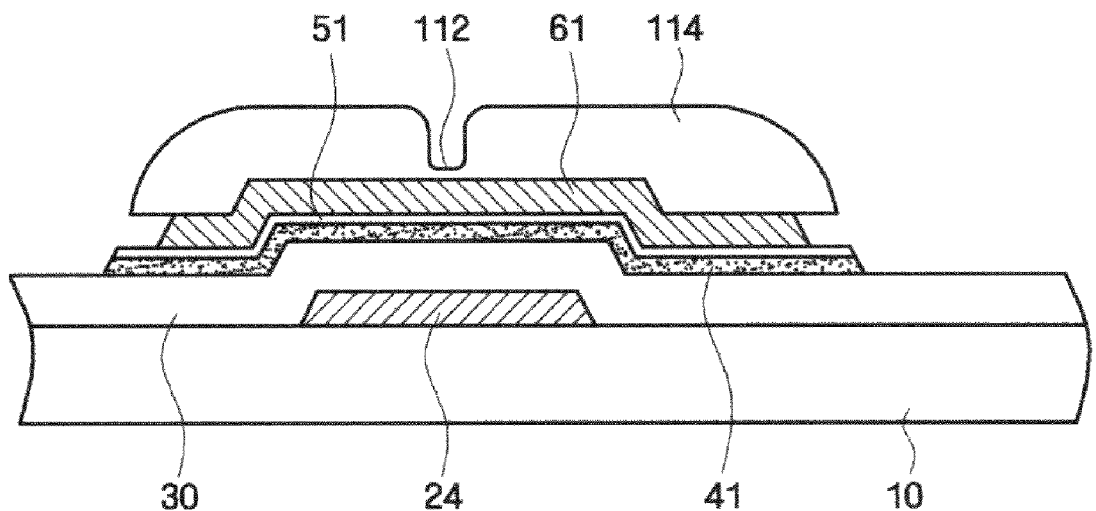

As shown in FIG. 5, formation of the conductive layer patterns 61 results in part of the active layer 40 to be exposed. As shown in FIGS. 1A, 5, and 6, the ohmic contact layer 50 and the active layer 40 provided under the ohmic contact layer are etched to form the incomplete ohmic contact layer pattern 51 and the incomplete active layer pattern 41 provided under the incomplete ohmic contact layer pattern 51. The ohmic contact layer 50 and the active layer 40 may be subjected to, for example, dry etching. The ohmic contact layer 50 and the active layer 40 are etched to expose the gate insulating layer 30.

Figure 7:
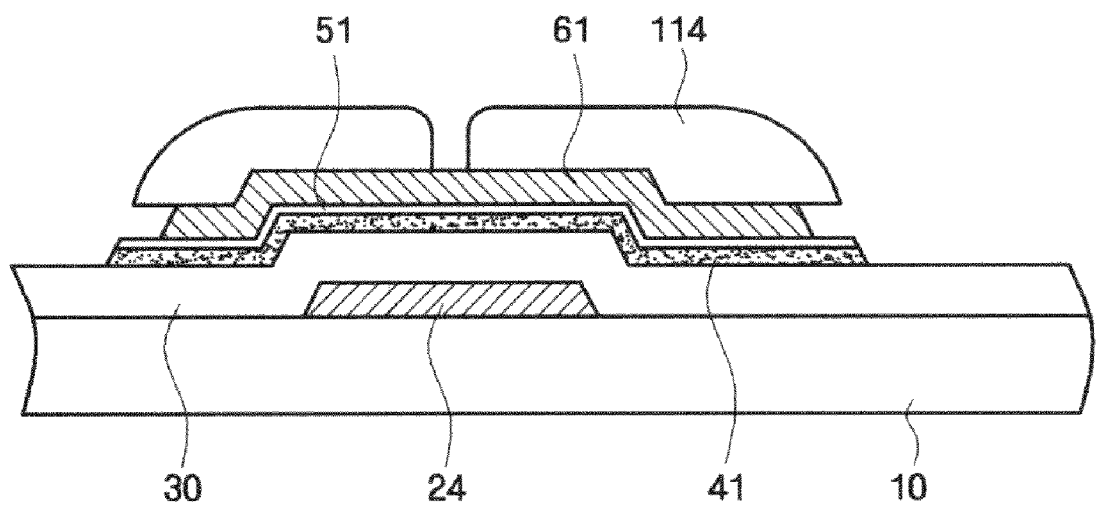

Subsequently, with reference to FIGS. 1A, 6, and 7, among the photoresist patterns 112 and 114 for the data wiring line, the photoresist pattern 112 for data wiring line having a small thickness is removed to expose the conductive layer pattern 61. The photoresist pattern 112 for a data wiring line having a small thickness may be removed by, for example, an ashing process using oxygen. The photoresist pattern 112 for the data wiring line having the small thickness of the photoresist patterns 112 and 114 may be removed in advance of etching the ohmic contact layer 50 and the active layer 40. In this case, the ashing process may be omitted.

Figure 8:
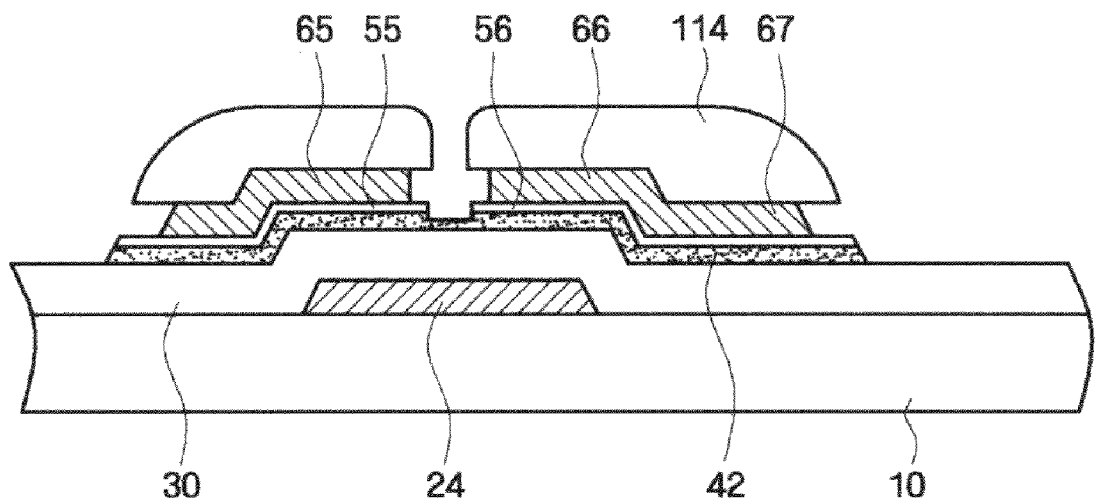

Subsequently, with reference to FIGS. 1A, 7, and 8, the exposed conductive layer pattern 61 for data wiring line of the channel region is etched using the photoresist pattern 114 for data wiring line having the large thickness as the etching mask. As a result, the source electrode 65, the drain electrode 66, and the drain electrode expanded part 67 are formed, and the incomplete ohmic contact layer pattern 51 is exposed in the area between the source electrode 65 and the drain electrode 66. Subsequently, the exposed portion of the incomplete ohmic contact layer pattern 51 is etched to perform separation. As a result, the production of the ohmic contact layer patterns 55 and 56 is finished. The incomplete active layer pattern 41 is exposed in the region in which the incomplete ohmic contact layer pattern 51 is etched. In this case, a portion of the incomplete active layer pattern 41 is etched to form the active layer pattern 42.

Figure 9:
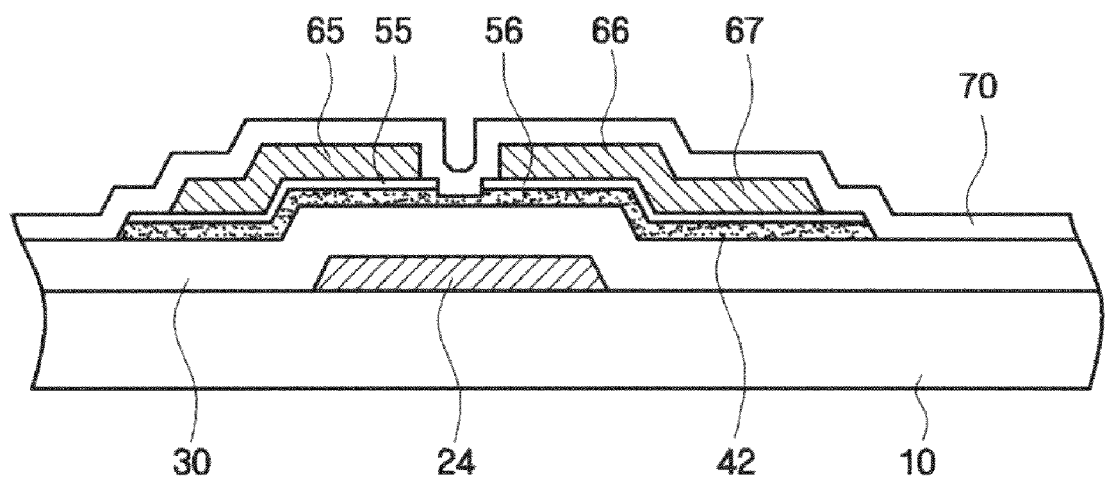

Subsequently, with reference to FIG. 9, a passivation layer 70 is layered on the resulting structure using, for example, CVD.

Figure 10:
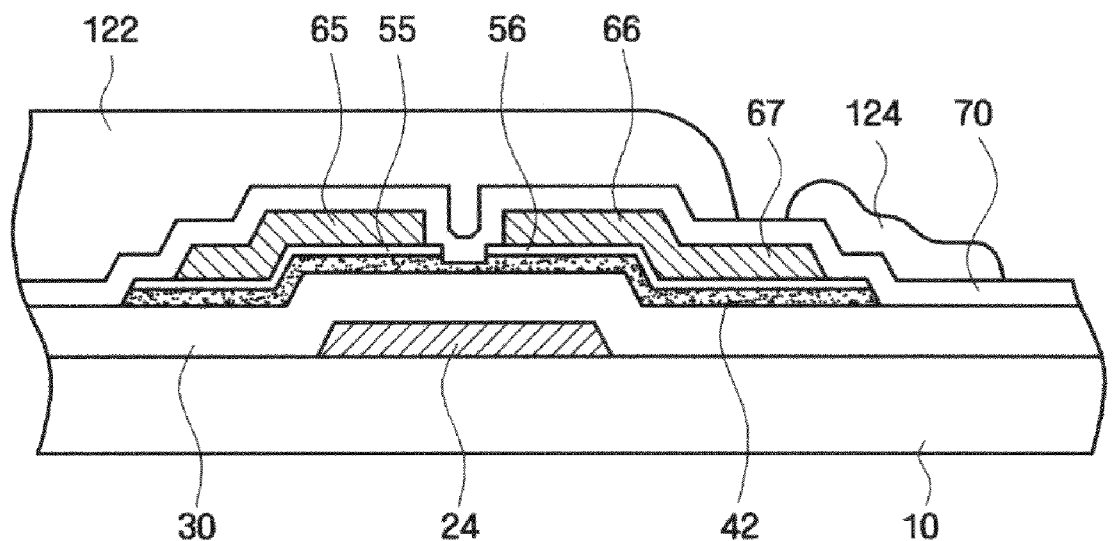

Subsequently, with reference to FIGS. 1A and 10, a photoresist substance is applied to the passivation layer 70 and then patterned to form the photoresist patterns 122 and 124. The photoresist patterns 122 and 124 include a first region 122 and a second region 124. The first region 122 is formed on the portion of the passivation layer 70 provided on the data wiring lines 62, 65, and 66, but not on the portion of the passivation layer 70 and the drain electrode expanded part 67 provided on the gate wiring lines 22 and 24. Since the mask covers the first region 122, the first region 122 is not exposed, and the pixel region is exposed. Since the photoresist substance is exposed using, for example, the slit mask, the second region 124 has the thickness that is smaller than that of the first region 122. The second region 124 is formed on the portion of the passivation layer 70 provided on the active layer pattern 42 that protrudes from the drain electrode expanded part 67, and the portion of the passivation layer 70 provided on the gate insulating layer 30 that protrudes from the active layer pattern 42. In addition, the second region 124 may be formed on the portion of the passivation layer 70 provided on the storage wiring line 28. The second region 124 is spaced apart from the first region 122, and at least a portion of the passivation layer 70 that is provided on the drain electrode expanded part 67 is exposed in the gap between the first region 122 and the second region 124. Since the mask does not cover the gap between the first region and the second region, the gap is exposed to light during the exposure process.

Figure 11:
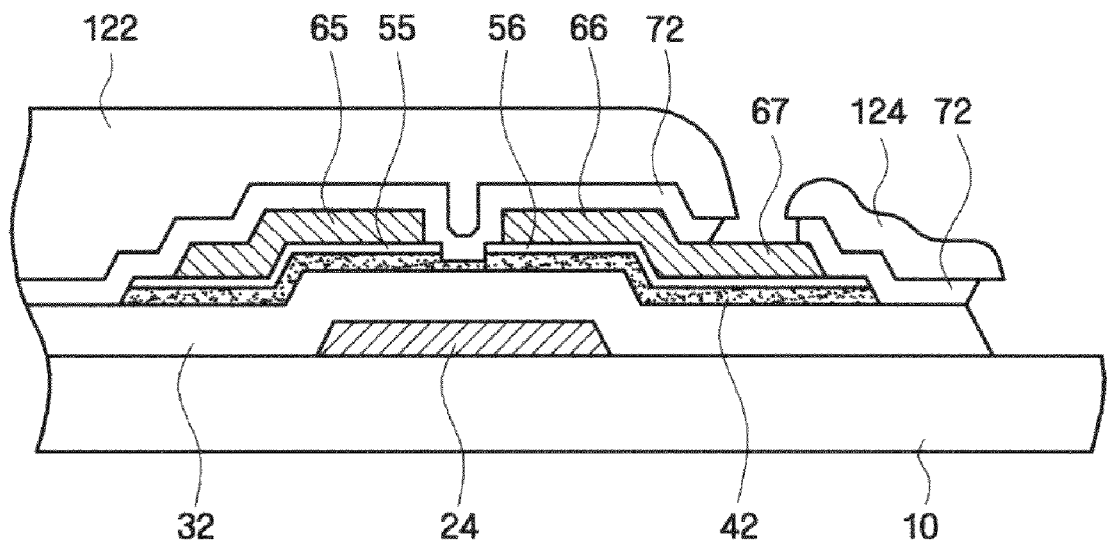

Subsequently, with reference to FIGS. 10 and 11, the exposed passivation layer 70 is subjected to first etching using the photoresist patterns 122 and 124 as the etching mask to form the passivation layer patterns 72. The etching of the passivation layer 70 is performed using a dry etching process. The passivation layer patterns 72 are spaced apart from each other to expose a portion of the drain electrode expanded part 67 provided under the photoresist patterns 122 and 124. Furthermore, the gate insulating layer 30 may be etched to form the gate insulating layer pattern 32. During the first etching, the overetching of the passivation layer 70 may not occur. Examples of an etching gas that is used during the first etching include $CF_4$, $SF_6$, $CHF_3$, $O_2$, or a mixture thereof. The etching rate may be controlled by adjusting the concentrations or proportions of the constituent elements.

Figure 12:
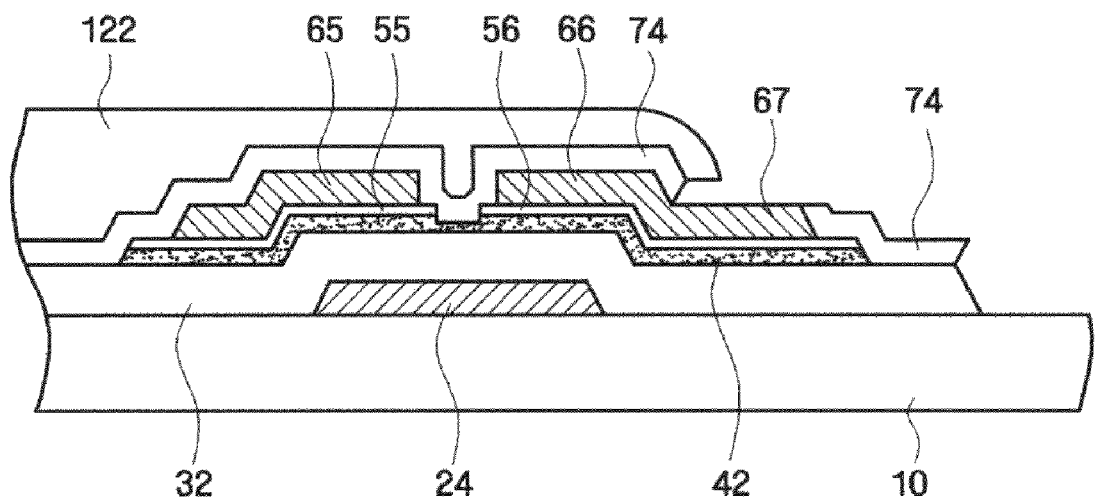

Subsequently, with reference to FIGS. 11 and 12, an etch back process is performed to remove the second region 124 using a stripper. In this case, the thickness of the first region 122 is reduced. Next, the passivation layer pattern 72 is subjected to second etching using the first region 122 as the etching mask to form the overetched passivation layer pattern 74. Accordingly, an undercut is formed in the first region 122 so that the first region 122 protrudes from the overetched passivation layer pattern 74 and an area of the exposed drain electrode expanded part 67 is enlarged. In this case, the etching gas that is used during the second etching may be the same as the first etching gas. Alternatively, the first and the second etching gases may be different from each other in terms of the concentration or proportion of the constituent elements. It is preferable that the length of the first region 122 protruding from the overetched passivation layer pattern 74 be 3 μm or more so that a cut portion is formed during the application of a conductive substance for pixel electrodes (see reference numeral 80 of FIG. 13) as described below.

After the first etching and the second etching are performed, the drain electrode expanded part 67 and the insulating substrate 10 of the pixel region are exposed.

Figure 13:
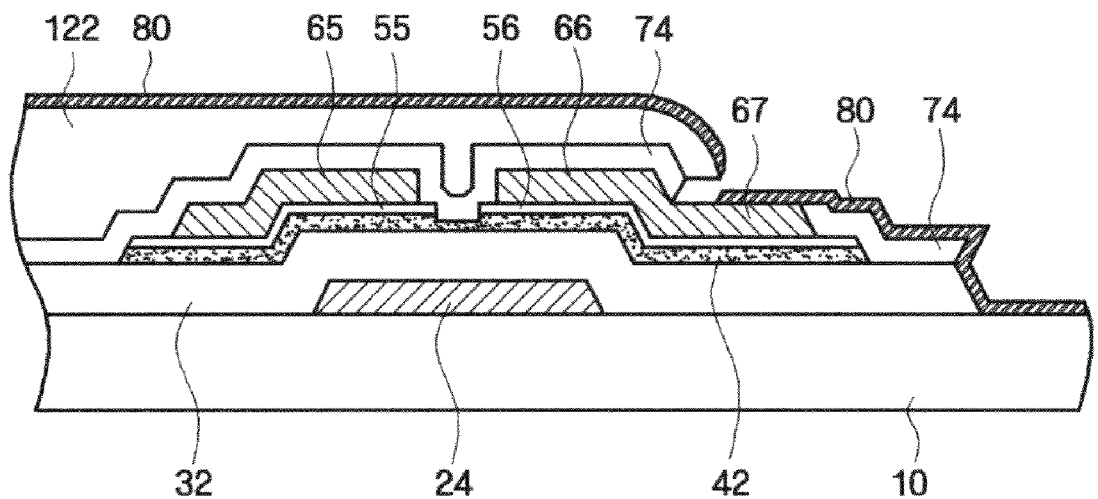

Subsequently, with reference to FIGS. 1A, 12, 13, for example, a conductive substance for a pixel electrode 80 containing zinc oxide is layered on the whole surface of the resulting structure using a deposition process, such as sputtering. To be more specific, the conductive substance for pixel electrode 80 may be made of a substance that contains zinc oxide and one or more of $Al_2O_3$, $AlF_3$, $B_2O_3$, $Ga_2O_3$, $Y_2O_3$, $SiO_2$, $SiO$, $TiO_2$, $ZrO_3$, $HfO_2$, and $GeO_2$ as an additive. The additive is selected in consideration of the desired resistance of the substance and a current characteristic of the thin film transistor substrate. Examples of the conductive substance for a pixel electrode 80 may include ZAO. In the case of when the ZAO is used as the conductive substance for pixel electrode 80, ZAO may be deposited at a deposition pressure in the range of 0.3 to 3.0 Pa and a temperature in the range of 25 to 120° C. to the thickness in the range of 10 to 200 nm. A portion of ZAO is layered on the first region 122 having a small thickness, and another portion of ZAO is layered on the structure that is not covered with the first region 122. In this case, since the conductive substance for the pixel electrode 80 that is made of the ZAO has poor step coverage, the conductive substance for the pixel electrode 80 is not layered on an undercut region of the first region 122 and the overetched passivation layer pattern 74. That is, the conductive substance for the pixel electrode 80 that is layered on the first region 122 and the conductive substance for the pixel electrode 80 that is layered on the portion other than the first region 122 are not connected to each other and the cut portion is formed at an end of the first region 122. As described above, since the portion of the conductive substance for the pixel electrode 80 includes the cut portion, efficiency of a subsequent lift off process may be improved. This results from the use of ZAO as the conductive substance for the pixel electrode 80. Lift off performance of ZAO will be described in detail.

Subsequently, with reference to FIGS. 1A, 1B, and 13, the first region 122 and the conductive substance for the pixel electrode 80 that is provided on the first region 122 are removed using the lift off process. To be more specific, when a stripper that contains, for example, amines or glycols, is injected to the above-mentioned cut portion by a spray process or a dip process to come into contact with the first region 122 of the photoresist patterns 122 and 124, the first region 122 is dissolved by the stripper to be separated from the overetched passivation layer pattern 74 and, at the same time, the conductive substance for the pixel electrode 80 that is made of ZAO and provided on the first region 122 is removed.

In connection with this, the removal of the first region 122 and the conductive substance for pixel electrode 80 that is provided on the first region 122 depends on a contact time and a contact area between the first region 122 and the stripper, and the step coverage and the deposition temperature of the conductive substance for the pixel electrode 80. Through the above-mentioned description, it can be understood that when the width of the undercut portion of the first region 122 which is formed by the overetched passivation layer pattern 74 under the first region 122 is not changed, the removal of the first region 122 and the conductive substance for the pixel electrode 80 provided on the first region 122 which depends on the step coverage of the conductive substance for the pixel electrode 80, that is, the lift off performance, is excellent.

In general, the lift off performance improves as the deposition temperature of the conductive substance for the pixel electrode 80 is reduced. Naturally, when the deposition temperature of the conductive substance for the pixel electrode 80 is low, the temperature of the chamber is reduced. However, since most of the deposition devices are operated at high temperatures (for example, about 100° C.), it is difficult to reduce the temperature of the devices. Accordingly, there is a need to find a conductive substance for the pixel electrode 80 that provides the desired level of lift-off performance even though the deposition is performed at the temperature that is almost the same as the operation temperature of the deposition chamber. The conductive substance for the pixel electrode 80 that can provide the desired level of lift-off performance may contain zinc oxide. To be more specific, the conductive substance for pixel electrode 80 may be made of a substance that contains zinc oxide and one or more of $Al_2O_3$, $AlF_3$, $B_2O_3$, $Ga_2O_3$, $Y_2O_3$, $SiO_2$, $SiO$, $TiO_2$, $ZrO_3$, $HfO_2$, and $GeO_2$ as an additive. As described above, examples of the conductive substance for pixel electrode 80 include ZAO. The step coverage and the lift off performance of the conductive substance for pixel electrode 80 that includes the ZAO, and the current-voltage characteristic of the thin film transistor substrate 1 that is produced using the conductive substance for pixel electrode 80 will be described in detail.

The first region 122 and the conductive substance for pixel electrode 80 that is provided on the first region 122 are removed to finish the production of the pixel electrode 82 that is formed directly on the insulating substrate 10 and comes directly into contact with the drain electrode expanded part 67. ZAO is used as the conductive substance for pixel electrode 80, and the pixel electrode 82 is formed using the lift-off process instead of patterning and etching to prevent a skew that may occur due to the high etching rate of ZAO.

A method of producing a thin film transistor substrate according to modification of the first embodiment of the present invention will now be described with reference to FIGS. 14 to 17. Hereinafter, a description may be omitted or briefly provided for the structure, constitution, and process that are the same as in the embodiment of FIGS. 1A, 1B, and 2 to 13, in the present invention, and the description will focus on the differences between the embodiments. FIGS. 14 to 17 are sectional views illustrating a method of producing thin film transistor substrate according to the second embodiment of the present invention.

The method of producing the thin film transistor substrate according to the second embodiment of the present invention is the same as the method according to the first embodiment of the present invention, with the exception of processes after the passivation layer 70 is formed on the insulating substrate 10.

Figure 14:
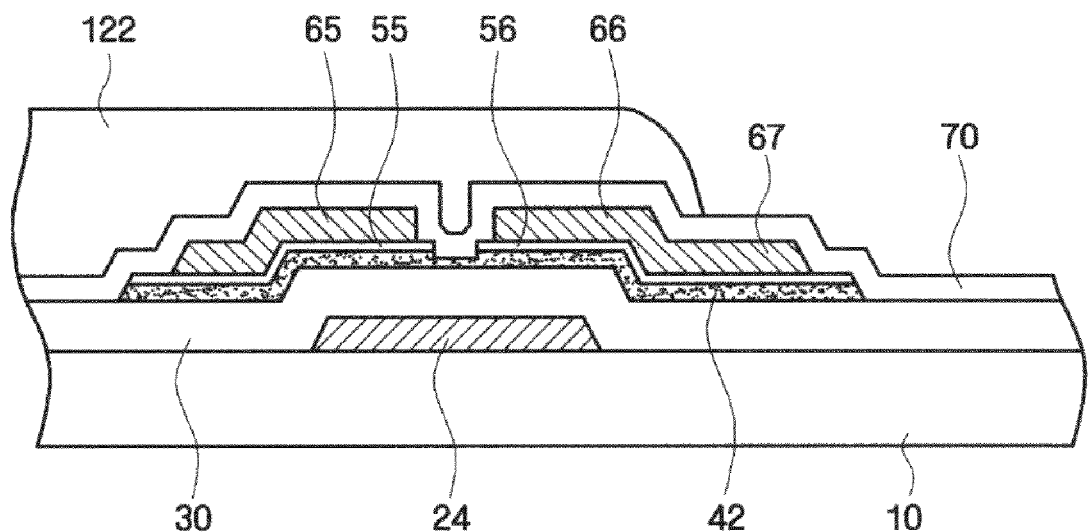
FIGS. 14 to 17 are sectional views illustrating a method of producing a thin film transistor substrate according to a second embodiment of the present invention.

With reference to FIG. 14, the first region 122 of the photoresist pattern is formed on the passivation layer 70. Unlike in the first embodiment, the second region (see reference numeral 124 of FIG. 10) is not provided in the second embodiment. Since the first region 122 of the photoresist pattern of the second embodiment is substantially the same as the first region (see reference numeral 122 of FIG. 10) of the first embodiment of the present invention, a description thereof is omitted.

Figure 15:
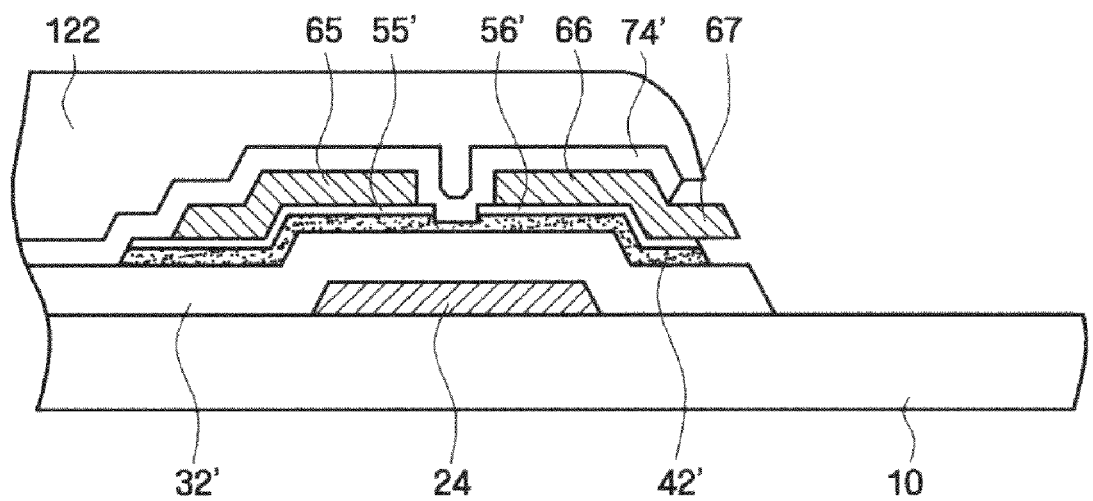

Subsequently, with reference to FIGS. 14 and 15, the exposed passivation layer 70 is etched using the first region 122 as the etching mask. As a result, an overetched passivation layer pattern 74' is formed. Accordingly, the undercut is formed in the first region 122 so that the first region 122 protrudes from the overetched passivation layer pattern 74'. That is, in the present modification, the second etching is not performed, but the etching is performed once unlike the former embodiment. Therefore, examples of the etching gas may include $CF_4$, $SF_6$, $CHF_3$, $O_2$, and a mixture thereof. The etching rate may be controlled by adjusting the concentration or proportions of constituent elements to achieve the desired level of overetching. The ohmic contact layer patterns 55 and 56 of the active layer pattern 42 and the drain electrode 66 are etched by a single etching process to form an active layer pattern 42' and ohmic contact layer patterns 55' and 56'. Accordingly, an end of the drain electrode expanded part 67 protrudes on the sidewall between the overetched passivation layer pattern 74' and an ohmic contact layer 56'. In addition, the gate insulating layer 30 is patterned to form a gate insulating layer pattern 32'.

Figure 16:
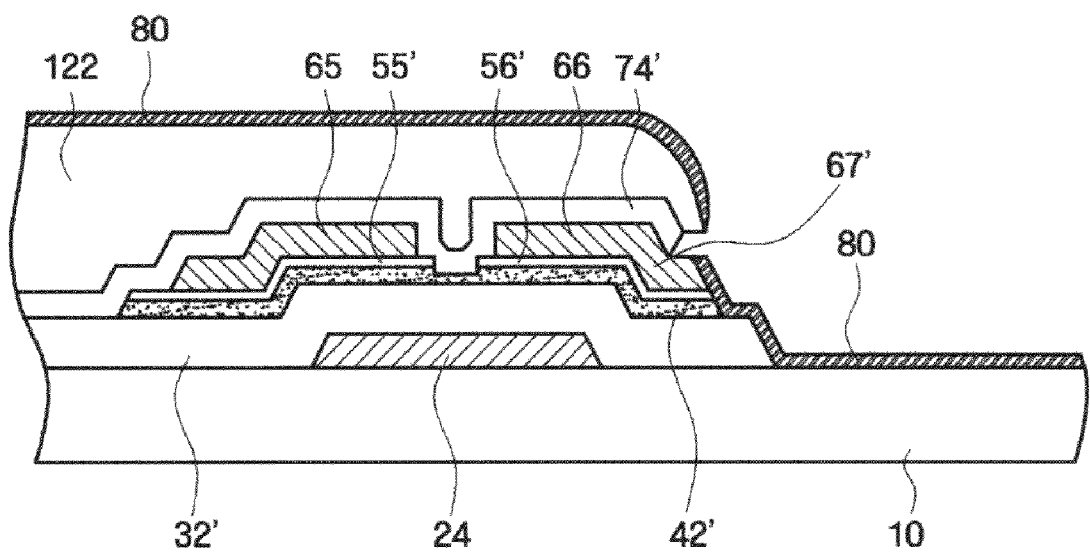

Subsequently, with reference to FIGS. 15 and 16, the protruding drain electrode expanded part 67 is etched to form a deformed drain electrode expanded part 67'. Accordingly, the overetched passivation layer pattern 74', the deformed drain electrode expanded part 67', the ohmic contact layer patterns 55' and 56', and the active layer pattern 42' have inclined lateral surfaces. The lateral surface of the overetched passivation layer pattern 74' inclines at a different angle than the lateral surface of the deformed drain electrode expanded part 67', and the undercut of the first region 122 extends into the overetched passivation layer pattern 74'. Subsequently, the conductive substance for the pixel electrode 80 containing, for example, zinc oxide, is layered on the whole surface of the resulting structure using a deposition process such as sputtering. Preferable examples of the conductive substance for the pixel electrode 80 are the same as those of the former embodiment. A portion of the conductive substance for pixel electrode 80 is layered on the first region 122, and another portion of the conductive substance for pixel electrode 80 is layered on the exposed structure that is not covered with the first region 122. The two portions are not connected to each other, but cut due to poor step coverage of the conductive substance for the pixel electrode 80.

Figure 17:
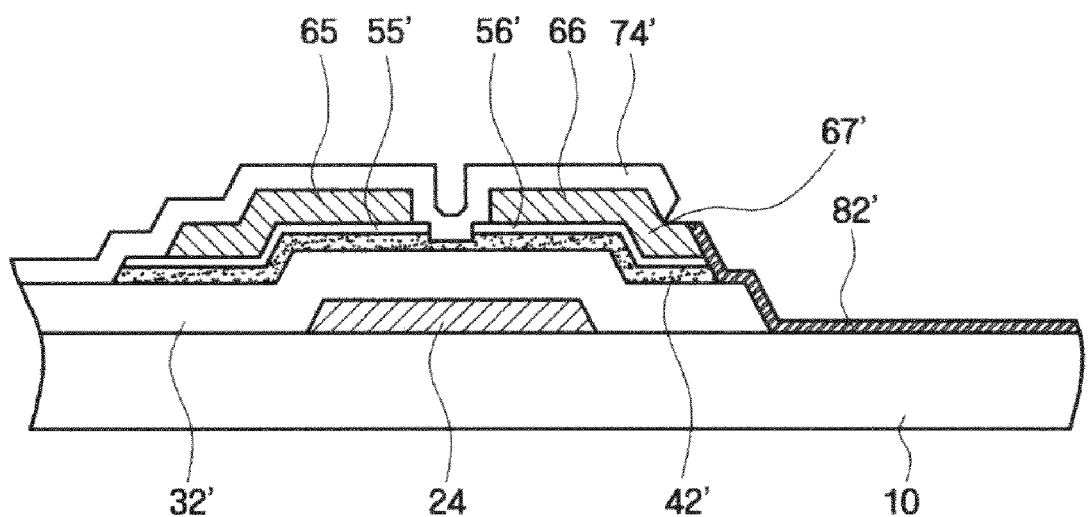

Subsequently, with reference to FIGS. 16 and 17, the first region 122 and the conductive substance for pixel electrode 80 that is provided on the first region 122 are removed using the lift-off process. During the lift-off process, when a stripper is injected to the above-mentioned cut portion to separate the first region 122 from the overetched passivation layer pattern 74' and, at the same time, the conductive substance for the pixel electrode 80 that is provided on the first region 122 is removed. Accordingly, a pixel electrode 82' is formed. As described above, the lift-off performance is affected by the step coverage and the deposition temperature of the conductive substance for the pixel electrode 80.

Hereinafter, the lift off performance of ZAO that is used as the conductive substance for the pixel electrode 80 of the thin film transistor substrate that is produced according to the first embodiment and the second embodiment of the present invention will be compared to that of another conductive substance, and characteristics of the thin film transistor substrates that are produced according to the first embodiment and the modification of the first embodiment will be described with reference to FIGS. 18 to 21.

Figure 18:
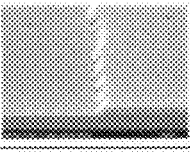
FIG. 18 schematically illustrates solubility of a conductive substance for a pixel electrode in a stripper, wherein the conductive substance is used to produce the thin film transistor substrate according to the first embodiment of the present invention.

With reference to FIGS. 1A, 1B, 13, 16, 17, and 18, stripper solubilities of ZAO and IZO that are used as the conductive substance for the pixel electrode 80 according to the first embodiment and the second embodiment of the present invention are compared to each other. FIG. 18 schematically illustrates the stripper solubility of the conductive substance for the pixel electrode 80 that is used to produce the thin film transistor substrate according to the first embodiment of the present invention.

The conductive substance for the pixel electrode 80 that is deposited on the upper surface of the first region 122 is removed by means of the lift off process using the stripper. The stripper that is used during the removal process is filtered and recycled through a stripper tank. In this case, the conductive substance for the pixel electrode 80 as well as the photoresist substance remains in the stripper. Accordingly, when the stripper is reused after the recycling, the conductive substance for the pixel electrode 80 remaining in the stripper may be deposited on the pixel region during the subsequent lift off process, thus forming defective pixels. In order to prevent the formation of defective pixels, the stripper solubility of the conductive substance for the pixel electrode 80 is chosen to be above a critical level.

With reference to FIG. 18, the stripper solubilities of ZAO and IZO that are used in the first embodiment and the second embodiment are compared to each other under the same condition. That is, the solubilities of ZAO and IZO in the stripper are compared to each other under four test conditions: (1) when stripping is performed using a typical lift off process for 140 sec, (2) when typical stripping is performed for 140 sec and the conductive substance for pixel electrode 80 is then dipped in the stripper for 1 min, (3) when typical stripping is performed for 140 sec and the conductive substance for pixel electrode 80 is then dipped in the stripper for 5 min, and (4) when typical stripping is performed for 140 sec and the conductive substance for pixel electrode 80 is then dipped in the stripper for 10 min. In FIG. 18, the lower portion is an insulating substrate and the upper portion is a pixel electrode 80 not stripped by a stripper. As seen in FIG. 18, the solubility of ZAO in the stripper is better than that of IZO in the stripper under the four test conditions. Particularly, under test condition (3), since ZAO is dissolved in the stripper, after the lift-off process is performed using the stripper, all of the ZAO is dissolved while the stripper passes through the filter and the stripper tank. Thus, it is possible to prevent the formation of defective pixels that is caused by deposition of ZAO on the pixel region during the subsequent lift-off process. In addition, since it is unnecessary to frequently replace the filter, the production cost is reduced.

Figure 19:
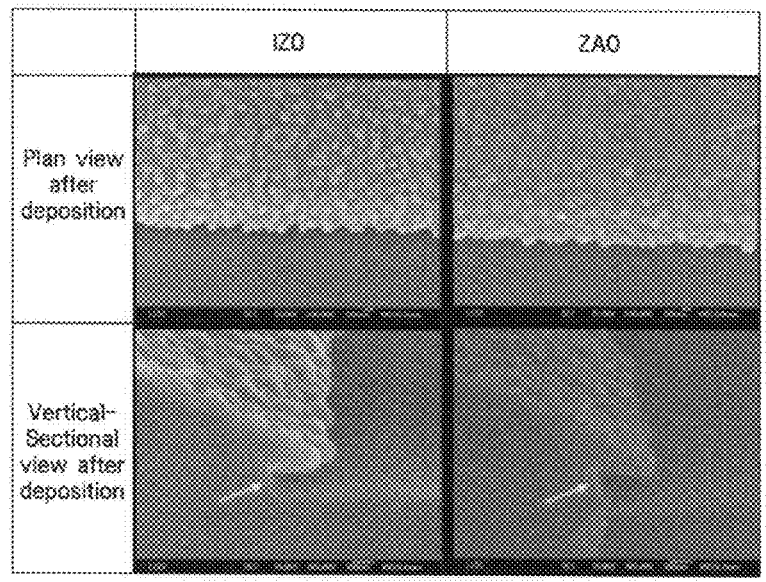
FIG. 19 schematically illustrates the step coverage of the conductive substance for the pixel electrode that is used to produce the thin film transistor substrate according to the first embodiment of the present invention.
Figure 20:
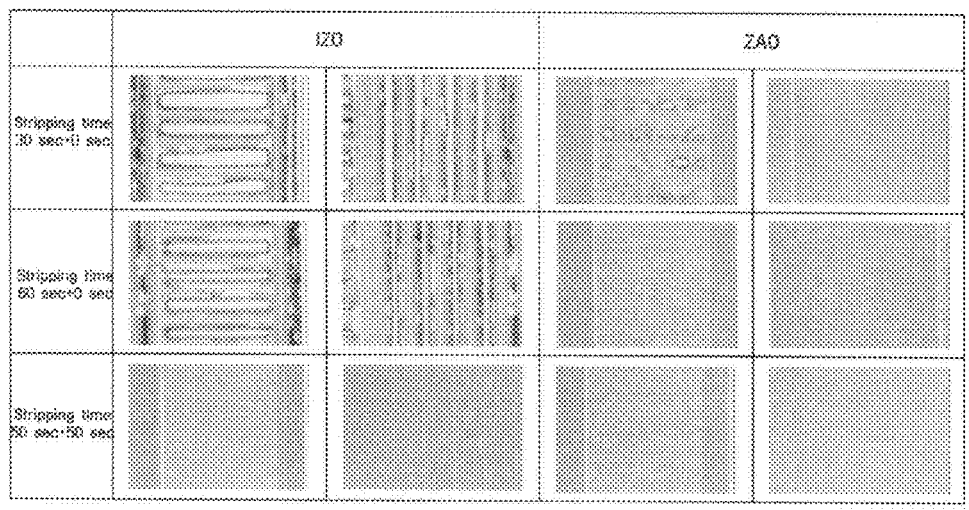
FIG. 20 schematically illustrates lift-off performance of the conductive substance for the pixel electrode that is used to produce the thin film transistor substrate according to the first embodiment of the present invention.

With reference to FIGS. 1A, 1B, 13, 16, 17, 19, and 20, the step coverages and the lift-off performances of the conductive substances for the pixel electrode 80 that are used in the first embodiment and the second embodiment are compared. FIG. 19 schematically illustrates the step coverage of the conductive substance for the pixel electrode that is used to produce the thin film transistor substrate according to the first embodiment of the present invention. FIG. 20 schematically illustrates the lift-off performance of the conductive substance for the pixel electrode 80 that is used to produce the thin film transistor substrate according to the first embodiment of the present invention.

The conductive substances for the pixel electrode 80 are deposited on the first region 122. The IZO is deposited at normal temperature, and the ZAO is deposited at 100° C. Next, the surfaces on which the conductive substances for pixel electrode 80 are deposited are observed using a scanning electron microscope (SEM), and plan views and sectional views of the observed surfaces are shown in FIG. 19. From FIG. 19, it can be seen that a difference in deposition characteristic of the IZO and the ZAO is insignificant in the plan views. However, in the sectional views, the step coverage of the IZO that is indicated by the arrow and has the bright color is better than that of the ZAO. In general, it is known that the step coverage is poorer in the case of low temperature deposition than in the case of high temperature deposition. It can be seen that, since IZO is deposited at low temperatures, the step coverage of ZAO is poorer than that of IZO. As described above, in the case of when the step coverage is excellent, the lift off performance is reduced.

The lift-off performances of both the conductive substances for the pixel electrode 80 that are deposited under the above-mentioned conditions are shown in FIG. 20. The lift off performances of the IZO and the ZAO are compared with each other in the cases of when a stripping time is (1) 30 sec, (2) 60 sec, and (3) 50 sec+50 sec. In FIG. 20, with respect to each of the conductive substances for pixel electrode 80, the left column shows the center of the insulating substrate 10, and the right column shows the first region 122 and the conductive substance for the pixel electrode 80 of the photoresist pattern that remains at an edge of the insulating substrate 10. Spots or lines mean the first region 122 and the conductive substance for the pixel electrode 80 of the photoresist pattern that are not removed but remain on the insulating substrate 10. Under the above-mentioned conditions, FIG. 20 shows that the lift-off performance of ZAO is better than that of IZO. In general, it is known that the step coverage is poorer and the lift off performance is better in the case of the low temperature deposition of the conductive substance for the pixel electrode 80 in comparison with the case of the high temperature deposition. Accordingly, it can be seen that the lift-off performance of ZAO is better than that of IZO. In addition, since ZAO is deposited at about 100° C., the deposition of ZAO may be performed without reducing the temperature of the chamber. Therefore, it is possible to avoid the delay caused by adjusting the chamber temperature and the associated cost.

Figure 21:
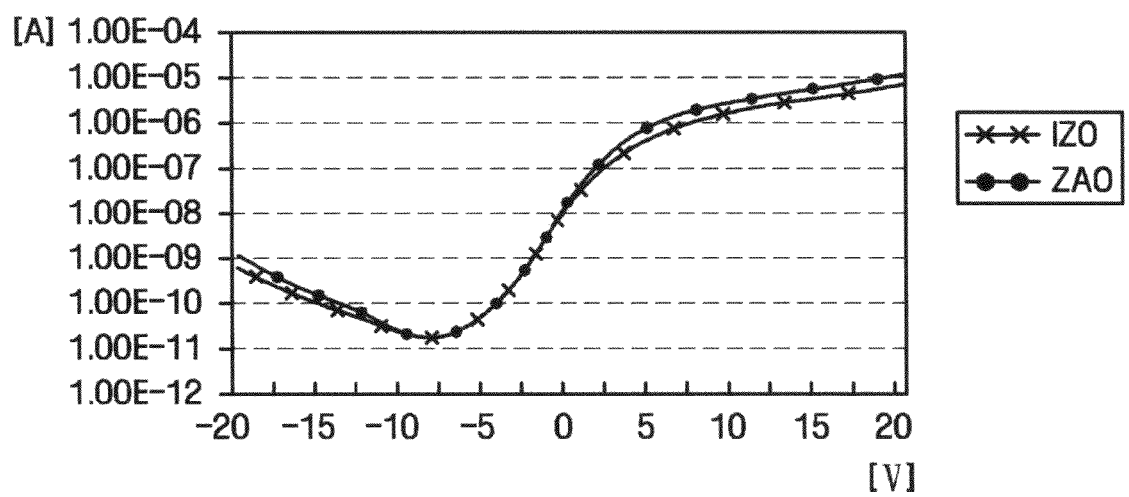
FIG. 21 schematically illustrates the performance characteristics of the thin film transistor substrate that is produced using a method according to the first embodiment of the present invention.

Hereinafter, the current-voltage characteristic of the thin film transistor substrate that is produced using the method according to the first embodiment and the second embodiment will be described with reference to FIG. 21. FIG. 21 schematically illustrates the performance characteristics of the thin film transistor substrate that is produced using the method of producing the thin film transistor substrate according to the first embodiment of the present invention.

With reference to FIG. 21, there is an insignificant difference in the current-voltage characteristic of the thin film transistor substrate (see reference numeral 1 of FIG. 1B) that includes the ZAO as the conductive substance for the pixel electrode (see reference numeral 80 of FIGS. 13 and 16) and the thin film transistor substrate that includes the IZO as the conductive substance for the pixel electrode. It can be seen that the thin film transistor substrate in which the pixel electrode (see reference numeral 82 of FIG. 1B and reference numeral 82' of FIG. 17) is formed using the ZAO has a lower price and better lift-off performance than the thin film transistor substrate in which the pixel electrode is formed using IZO even though they have similar properties.

Figure 22A:
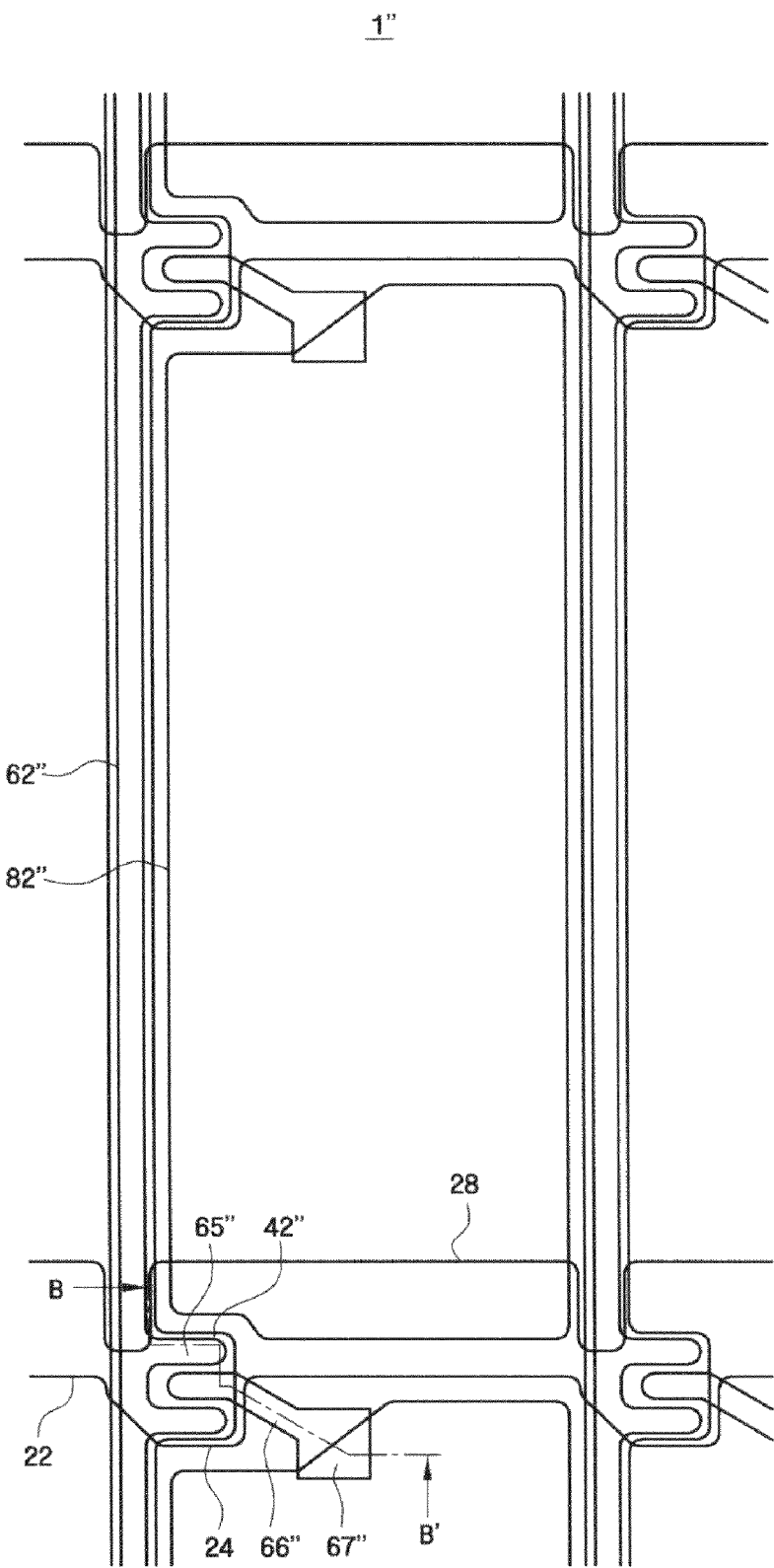
FIG. 22A is a layout view of a thin film transistor substrate according to a third embodiment of the present invention.
Figure 22B:
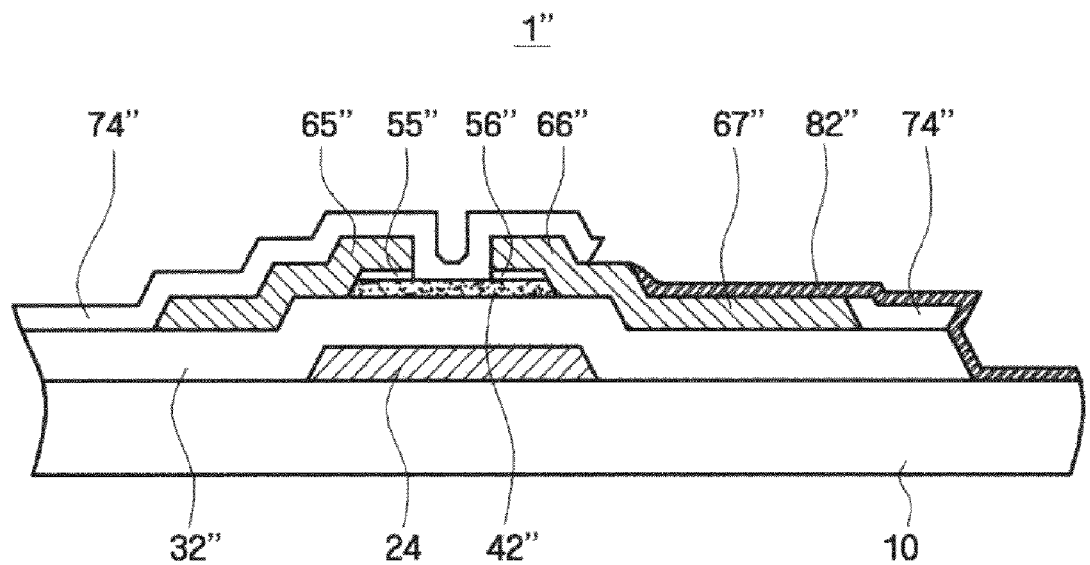
FIG. 22B is a sectional view of the thin film transistor substrate taken along the line B-B' of FIG. 22A.

A thin film transistor substrate according to a third embodiment of the present invention will be described with reference to FIGS. 22A and 22B. FIG. 22A is a layout view of the thin film transistor substrate according to the third embodiment of the present invention. FIG. 22B is a sectional view of the thin film transistor substrate taken along the line B-B' of FIG. 22A.

For convenience of description, the members that have the same function as the members shown in the drawings of the former embodiment are referred to as the same reference numeral, and the description thereof will be omitted or abbreviated. As shown in FIGS. 22A and 22B, the thin film transistor substrate according to the present embodiment has the same structure as the thin film transistor substrate 1 according to the former embodiment of the present invention, except that structures or positions of the active layer pattern 42", the data wiring lines 62", 65", 66", and 67", and the overetched passivation layer pattern 74" of the thin film transistor substrate 1" according to the present embodiment are different from those of the former embodiments.

In the thin film transistor substrate according to the present embodiment, the active layer pattern 42" and the ohmic contact layer patterns 55" and 56" that are provided on the active layer pattern are formed as "islands." That is, the active layer pattern 42" and the ohmic contact layer patterns 55" and 56" that are provided on the active layer pattern according to the present embodiment may overlap the gate electrode 24. Accordingly, the active layer pattern 42" and the ohmic contact layer patterns 55" and 56" that are provided on the active layer pattern may not be formed under the data line 62".

The source electrode 65" and the drain electrode 66" are spaced apart from each other so they do not cover a portion of the ohmic contact layer patterns 55" and 56". The source electrode and the drain electrode are formed on the ohmic contact layer patterns 55" and 56" and the gate insulating layer pattern 32 so that the source electrode and the drain electrode do not overlap the entire ohmic contact layer patterns 55" and 56" but overlap a portion of the ohmic contact layer patterns. Meanwhile, the drain electrode expanded part 67" is formed on the gate insulating layer pattern 32".

A portion of the overetched passivation layer pattern 74" is formed on the data wiring lines 62", 65", and 66" with the exception of the drain electrode expanded part 67", and another portion of the overetched passivation layer pattern 74" is formed on the gate insulating layer pattern 32" overetched passivation layer pattern 74.

The pixel electrode 82" may be formed directly on the insulating substrate 10 in the pixel region, and cover an upper part of the overetched passivation layer pattern 74" and the drain electrode expanded part 67" that are formed on the gate insulating layer pattern 32. The pixel electrode 82" according to the present embodiment contains zinc oxide, and examples of the pixel electrode are the same as those of the former embodiment.

Hereinafter, a method of producing the thin film transistor substrate according to the third embodiment of the present invention will be described in detail with reference to FIGS. 23 to 29, 22A, and 22B. In the present embodiment, a description may be omitted or abbreviated for elements that are substantially the same as in the first embodiment and the second embodiment, and the description will focus on the differences between embodiments. FIGS. 23 to 29 are sectional views illustrating the steps of a method of producing a thin film transistor substrate according to the third embodiment of the present invention.

Figure 23:
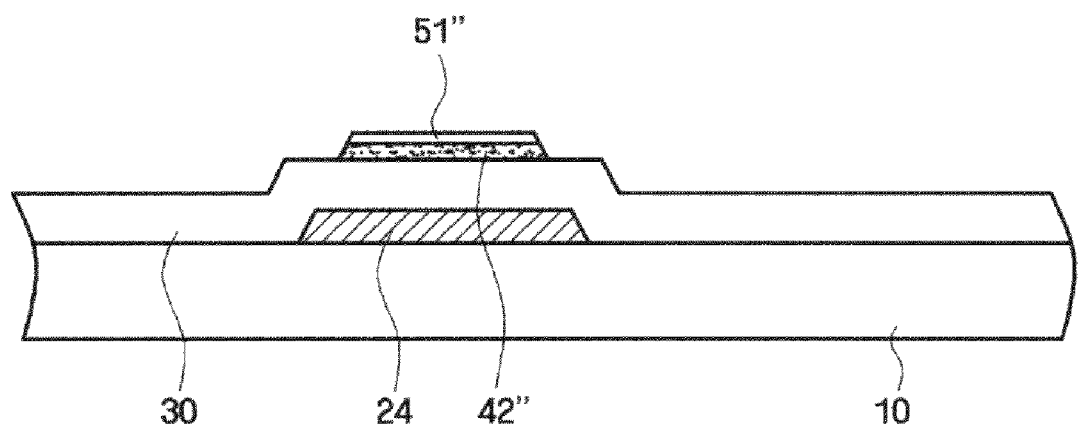
FIGS. 23 to 29 are sectional views illustrating a method of producing a thin film transistor substrate according to the third embodiment of the present invention.

With reference to FIGS. 22A, 22B, and 23, the gate wiring lines 22 and 24 that include the gate line 22 and the gate electrode 24, and the storage wiring line 28 are formed on the insulating substrate 10. Subsequently, the gate insulating layer 30 made of silicon nitride, an intrinsic amorphous silicon layer, and a doped amorphous silicon layer are sequentially deposited on the resulting structure using, for example, a chemical vapor deposition process, to the thickness of 150 to 500 nm, 50 to 200 nm, and 30 to 60 nm, respectively. The intrinsic amorphous silicon layer and the doped amorphous silicon layer are subjected to a photolithography process to form an island-type active layer pattern 42" and incomplete ohmic contact layer pattern 51" on the gate insulating layer 30 provided on the upper part of the gate electrode 24. The active layer pattern 42" according to the present embodiment does not protrude from the data wiring lines 62", 65", 66", and 67". Therefore, stability is assured.

Figure 24:
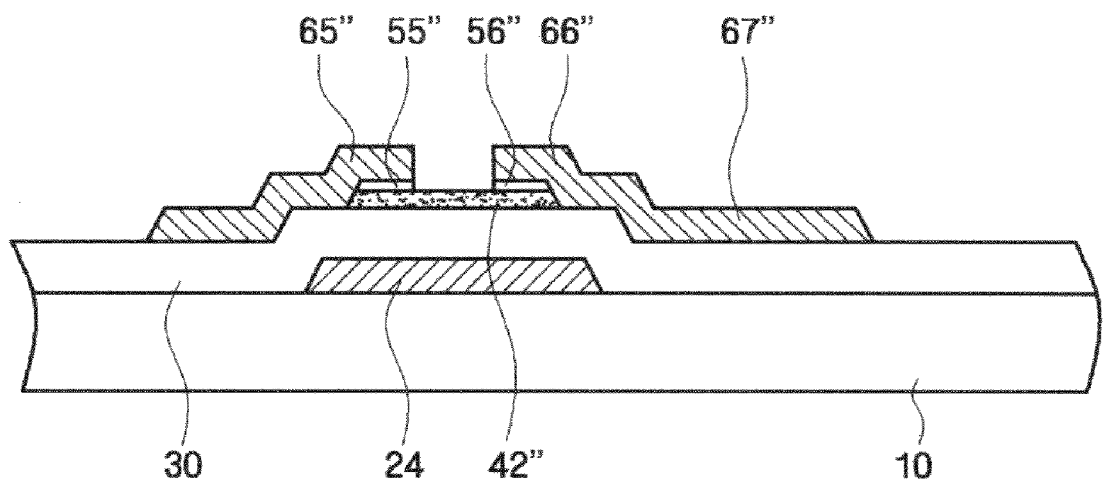

Subsequently, with reference to FIGS. 22A, 23, and 24, the data wiring lines 62", 65", 66", and 67" are formed on the resulting structure using sputtering. The data wiring lines 62", 65", 66", and 67" include the data line 62" that extends perpendicularly to the gate line 22, the source electrode 65" that is connected to the data line 62" and extends to the upper part of the gate electrode 24, the drain electrode 66" that is separated from the source electrode 65" and is located across the gate electrode 24 from the source electrode 65", and the drain electrode 66", and the drain electrode expanded part 67" that extends from the drain electrode 66" to overlap the storage wiring line 28 and has a large area.

Subsequently, the incomplete ohmic contact layer 51" that is not covered with the data wiring lines 62", 65", 66", and 67" is etched to form the ohmic contact layer patterns 55" and 56" and to expose the active layer pattern 42" between the ohmic contact layer patterns 55" and 56". In connection with this, it is preferable that an oxygen plasma process be performed in order to stabilize the exposed surface of the active layer pattern 42".

Figure 25:
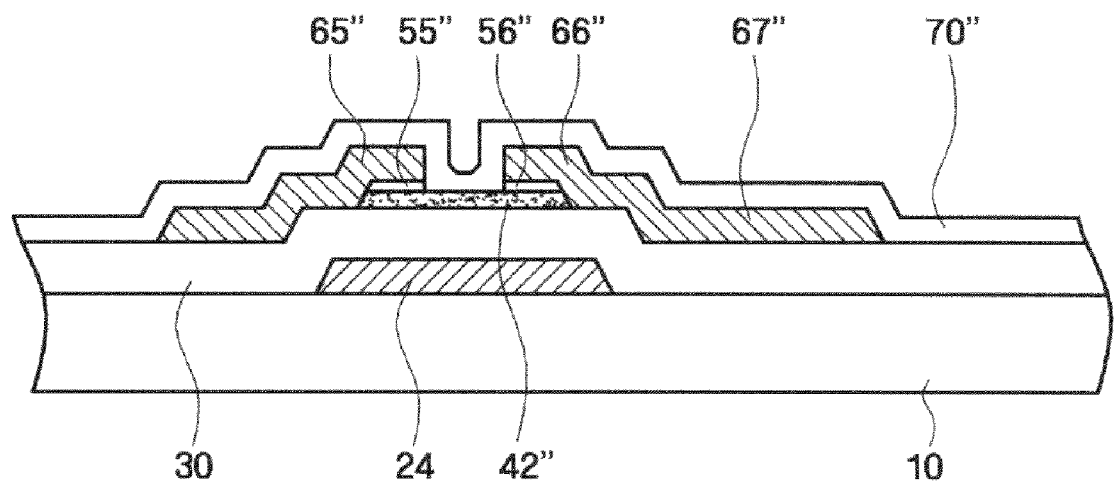

Subsequently, with reference to FIGS. 24 and 25, a passivation layer 70" is formed on the resulting structure.

Figure 26:
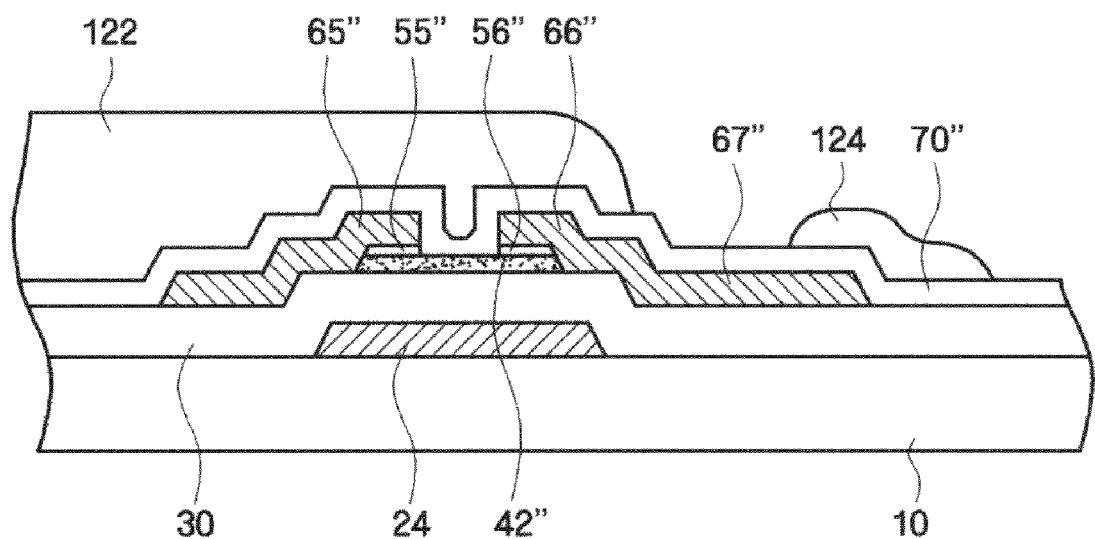

Subsequently, with reference to FIGS. 25 and 26, a photoresist substance is applied on the passivation layer 70" and patterned to form the photoresist patterns 122 and 124. The photoresist patterns 122 and 124 include the first region 122 and the second region 124 that is spaced apart from the first region 122. The second region 124 is thinner than the first region 122. The positions and the formation methods of the first and the second regions 122, 124 are the same as those of the former embodiment.

Figure 27:
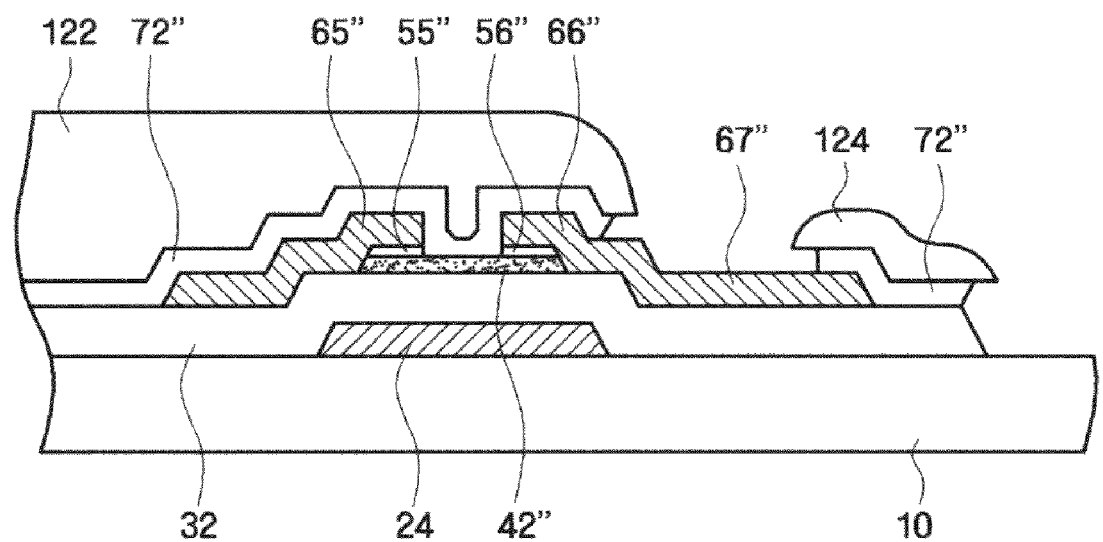

Subsequently, with reference to FIGS. 26 and 27, the passivation layer 70" that is exposed using the photoresist patterns 122 and 124 as the etching mask is subjected to first etching to form the passivation layer pattern 72". The type of the etching gas that is used to form the passivation layer pattern 72" and the position of the passivation layer pattern 72" are the same as those of the former embodiment, and the overetching of the passivation layer pattern 72" does not occur.

Figure 28:
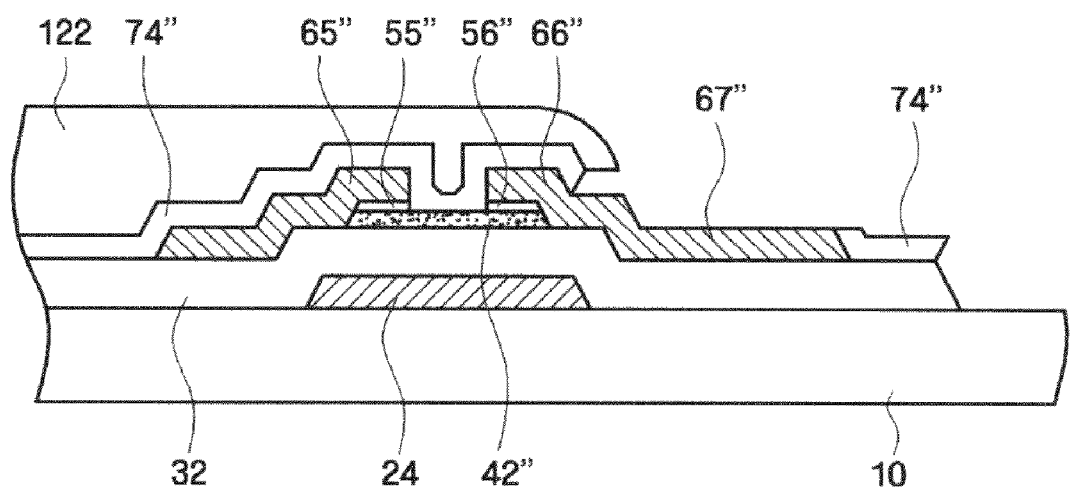

Subsequently, with reference to FIGS. 27 and 28, an etch-back process is performed to remove the second region 124 using the stripper, thereby reducing the thickness of the first region 122. The passivation layer pattern 72" is subjected to a second etching using the first region 122 having a reduced thickness as the etching mask to form the overetched passivation layer pattern 74". Accordingly, the undercut is formed in the first region 122 so that the first region 122 protrudes from the overetched passivation layer pattern 74". In addition, the exposed area of the drain electrode expanded part 67" is increased. The composition of the etching gas is controlled so that the overetched passivation layer pattern 74" is capable of being formed. However, since the source electrode 55", the drain electrode 56", and the drain electrode expanded part 67" cover the active layer pattern 42" and the ohmic contact layer patterns 55" and 56", the active layer pattern 42" and the ohmic contact layer patterns 55" and 56" are not etched during the first and the second etching processes of the present embodiment unlike the first embodiment of the present invention.

Figure 29:
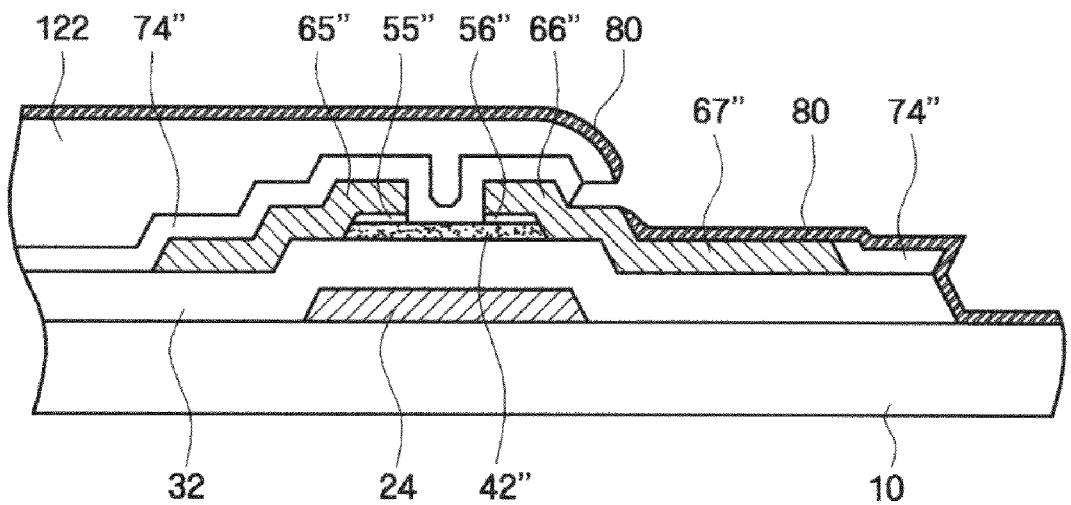

Subsequently, with reference to FIGS. 1A, 28, and 29, the conductive substance for the pixel electrode 80 is layered on the resulting structure using a deposition process such as a sputtering process. In this case, the deposition condition is the same as that of the former embodiment. Additionally, like the former embodiment, since the conductive substance for the pixel electrode 80 that is used has poor step coverage, the conductive substance for the pixel electrode 80 is not layered but the cut portion is formed on the undercut portion of the first region 122 and the overetched passivation layer pattern 74".

Subsequently, with reference to FIGS. 22A, 22B, and 29, the first region 122 and the conductive substance for the pixel electrode 80 that is provided on the first region 122 are removed using the lift-off process to form the pixel electrode 82". The stripper is injected into the cut portion of the layer in which the conductive substance for the pixel electrode 80 is formed to separate the first region 122 from the overetched passivation layer pattern 74" and to remove the conductive substance for the pixel electrode 80 provided on the first region like the former embodiment.

A method of producing the thin film transistor substrate according to the modification of the third embodiment of the present invention will be described with reference to FIGS. 30 to 33. Hereinafter, a description may be omitted or abbreviated for a structure, constitution, and process that is substantially the same as in the embodiment of FIGS. 22 to 29, and the description will focus on the differences between the embodiments. FIGS. 30 to 33 are sectional views illustrating a method of producing a thin film transistor substrate according to a fourth embodiment of the present invention.

The method of producing the thin film transistor substrate according to the fourth embodiment is the same as the method according to the third embodiment of the present invention, with the exception of the processes after the passivation layer 70" that is formed on the insulating substrate 10.

Figure 30:
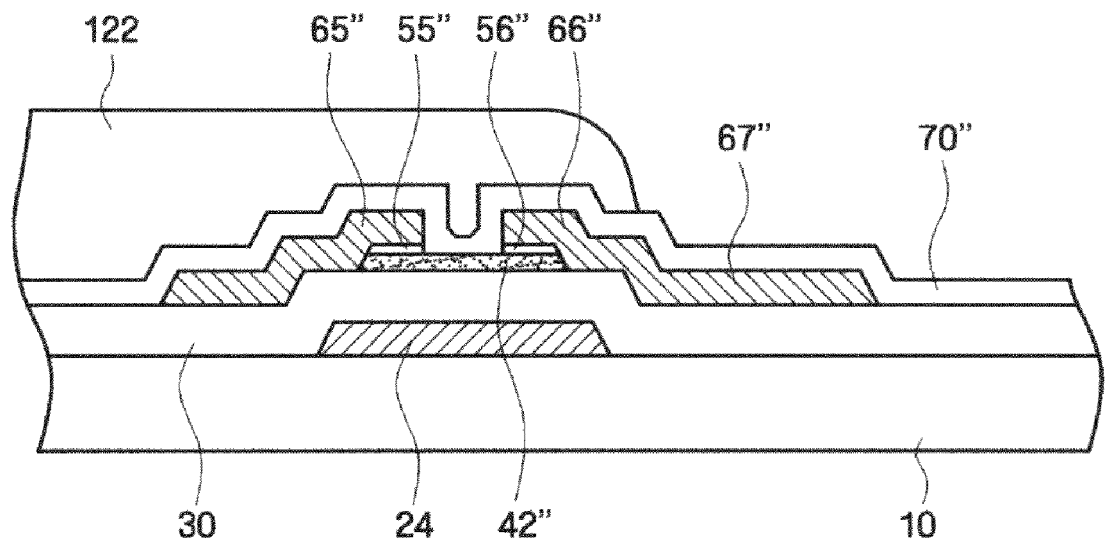
FIGS. 30 to 33 are sectional views illustrating a method of producing a thin film transistor substrate according to modification of the third embodiment of the present invention.

With reference to FIG. 30, the first region 122 of the photoresist pattern is formed on the passivation layer 70". There is no second region (see reference numeral 124 of FIG. 26) in the fourth embodiment, unlike in the third embodiment.

Figure 31:
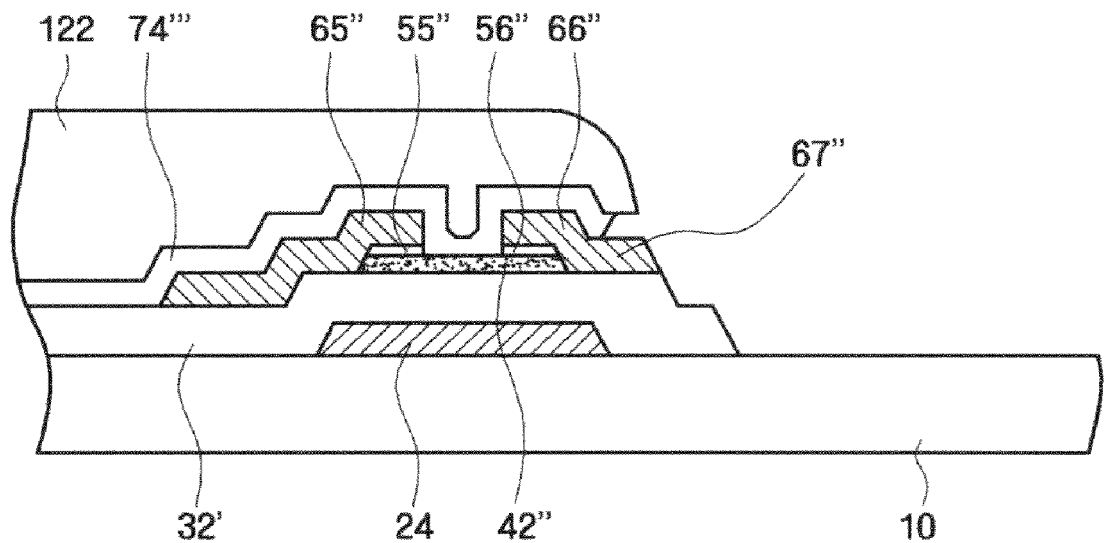

Subsequently, with reference to FIGS. 30 and 31, the exposed passivation layer 70" is etched once using the first region 122 as the etching mask. As a result, an overetched passivation layer pattern 74'" is formed. Accordingly, the undercut is formed in the first region 122 so that the first region 122 protrudes from the overetched passivation layer pattern 74'". That is, in the fourth embodiment, there is only one etching step. Accordingly, the composition of the etching gas is controlled to achieve the desired level of overetching. During the etching process, an end of the drain electrode expanded part 67" protrudes from the overetched passivation layer pattern 74'". In addition, the gate insulating layer 30 is patterned to form the gate insulating layer pattern 32' during the etching. Meanwhile, since the source electrode 55", the drain electrode 56", and the drain electrode expanded part 67" cover the active layer pattern 42" and the ohmic contact layer patterns 55" and 56", the active layer pattern 42" and the ohmic contact layer patterns 55" and 56" are not etched during the etching process, unlike in the first embodiment of the present invention.

Figure 32:
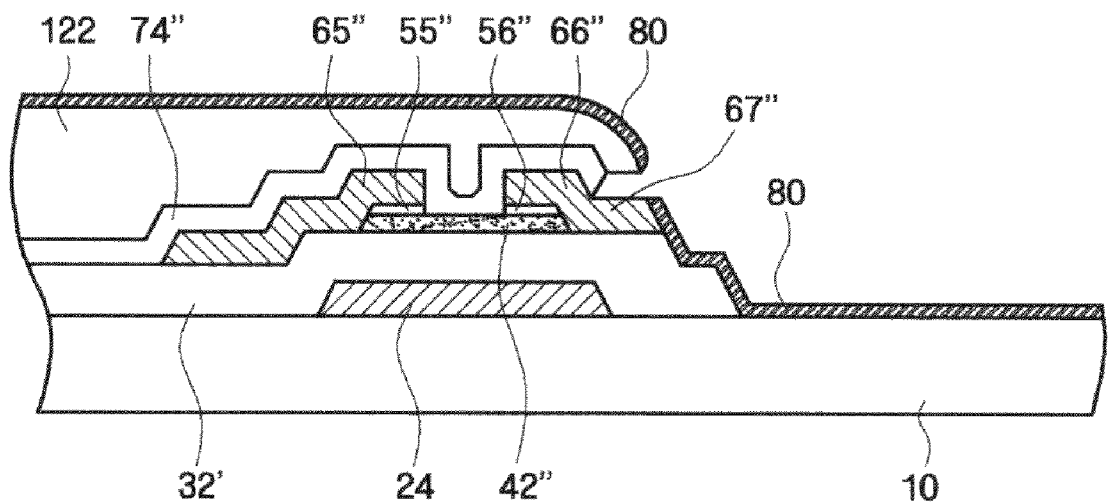

Subsequently, with reference to FIGS. 31 and 32, the conductive substance for the pixel electrode 80 is layered on the entire surface of the resulting structure using a deposition process such as sputtering. Like the third embodiment, the conductive substance for pixel electrode 80 contains zinc oxides, and preferable examples of the conductive substance for the pixel electrode are the same as those of the third embodiment. A portion of the conductive substance for the pixel electrode 80 is layered on the first region 122, and another portion of the conductive substance for the pixel electrode 80 is layered on the exposed structure that is not covered with the first region 122. Like the third embodiment, the two portions are not connected to each other, but cut due to poor step coverage of the conductive substance for pixel electrode 80.

Figure 33:
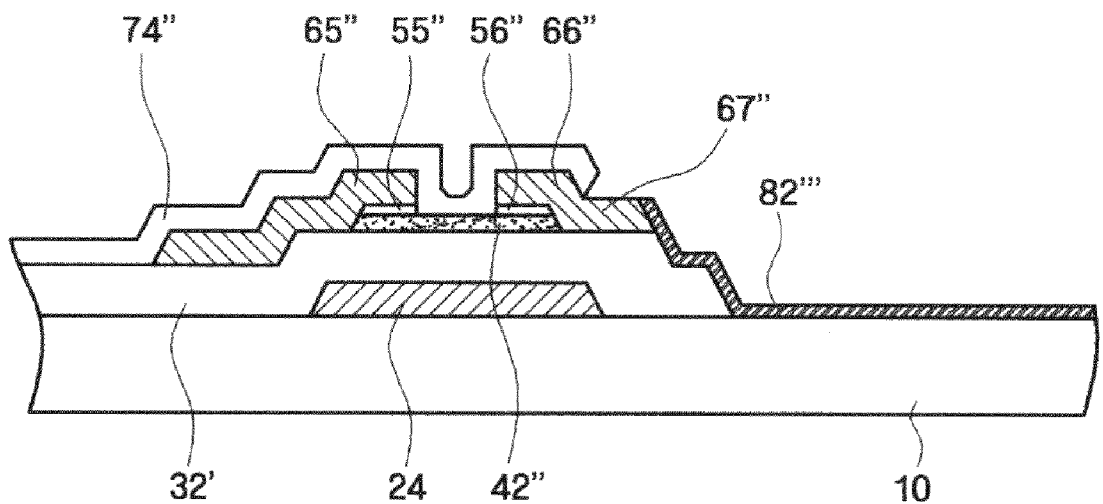

Subsequently, with reference to FIGS. 32 and 33, the first region 122 and the conductive substance for pixel electrode 80 that is provided on the first region 122 are removed using the lift-off process. Thus, a pixel electrode 82'" is formed. The lift-off process and the lift-off performance are the same as those of the third embodiment.

As described above, the thin film transistor substrates and the methods of producing the thin film transistor substrates according to the embodiments and the modifications of the present invention have one or more following advantages.

First, since the pixel electrode that includes low-priced zinc oxide is provided, it is possible to reduce the production cost of the thin film transistor substrate.

Second, since the lift-off process is applied using the strip of the conductive substance for the pixel electrode that includes zinc oxide, it is possible to easily form the thin film transistor substrate.

Third, since the conductive substance for the pixel electrode that contains zinc oxide is easily dissolved in the stripper, it is possible to improve a life of a filter when the stripper is reused and to prevent the formation of defective pixels where the conductive substance for the pixel electrode is attached to the pixel region.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. A method of producing a thin film transistor substrate, the method comprising:
    forming a gate wiring line comprising a gate electrode on an insulating substrate;
    forming a data wiring line comprising a source electrode and a drain electrode on the gate wiring line;
    forming a passivation layer pattern on the data wiring line except for a part of the drain electrode and a pixel region; and
    forming a pixel electrode electrically connected to the drain electrode and comprising aluminum-doped zinc oxide (ZAO),
    wherein the forming of the passivation layer pattern comprises:
    forming a passivation layer on the gate wiring line and the data wiring line;
    forming a photoresist pattern on the passivation layer to remove the passivation layer from the drain electrode and the pixel region, the photoresist pattern including a first region and a second region, the first region formed on the gate wiring line and the data wiring line with the exception of a part of the drain electrode, and the second region formed between an end of the drain electrode and the pixel region, the second region being thinner than the first region; and
    overetching the passivation layer using the photoresist pattern as an etching mask.

2. The method of claim 1, wherein the overetching of the passivation layer comprises:
    performing a first etching of the passivation layer using the photoresist pattern as the etching mask;
    stripping the second region; and
    performing a second etching of the passivation layer so that an undercut is formed in the passivation layer under the first region.

3. The method of claim 2, wherein the overetching of the passivation layer comprises:
    etching the passivation layer using the photoresist pattern as the etching mask so that the undercut is formed in the passivation layer.

4. The method of claim 1, wherein the photoresist pattern is formed on the gate wiring line and the data wiring line with the exception of a part of the drain electrode.

5. The method of claim 1, wherein the forming of the pixel electrode comprises:
    applying a conductive substance for the pixel electrode to the entire surface of the insulating substrate including where the photoresist pattern is formed; and
    performing a lift off process of the conductive substance for the pixel electrode formed on the photoresist pattern by removing the photoresist pattern to form the pixel electrode.

6. The method of claim 5, wherein the performing of the lift off process of the conductive substance for the pixel electrode comprises:
    removing the photoresist pattern from the gate wiring line and the data wiring line with the exception of a part of the drain electrode using a stripper so as to remove the conductive substance for the pixel electrode from the gate wiring line and the data wiring line with the exception of a part of the drain electrode.

7. The method of claim 6, wherein the conductive substance for the pixel electrode remains in the stripper after the performing of the lift off process, and the stripper is reused after being filtered and recycled through a stripper tank after the performing of the lift off process, and the conductive substance for the pixel electrode remaining in the stripper is dissolved in the stripper during recycling.

8. The method of claim 5, wherein the conductive substance for the pixel electrode comprises one or more of $Al_2O_3$, $AlF_3$, $B_2O_3$, $Ga_2O_3$, $Y_2O_3$, $SiO_2$, SiO, $TiO_2$, $ZrO_3$, $HfO_2$, and $GeO_2$ as an additive.

9. The method of claim 5, wherein the conductive substance for the pixel electrode comprises aluminum-doped zinc oxide (ZAO).

10. The method of claim 1, further comprising:
    forming a gate insulating layer on the gate wiring line after the forming of the gate wiring line,
    wherein the forming of the passivation layer pattern comprises etching the gate insulating layer to form a gate insulating layer pattern.

11. The method of claim 10, wherein the pixel electrode contacts the insulating substrate in the pixel region.

12. The method of claim 1, further comprising:
    forming an active layer on the gate wiring line before the forming of the data wiring line,
    wherein the forming of the passivation layer pattern comprises etching the active layer to form an active layer pattern.

13. The method of claim 12, wherein the active layer pattern and the data wiring line are formed using the same mask.

* * * * *